(12) United States Patent
Suzuki et al.

(10) Patent No.: US 11,972,931 B2
(45) Date of Patent: Apr. 30, 2024

(54) LIGHT EMITTING SEALED BODY, LIGHT EMITTING UNIT, AND LIGHT SOURCE DEVICE

(71) Applicants: HAMAMATSU PHOTONICS K.K., Hamamatsu (JP); ENERGETIQ TECHNOLOGY, INC., Wilmington, MA (US)

(72) Inventors: Akio Suzuki, Hamamatsu (JP); Toru Fujita, Hamamatsu (JP); Akinori Asai, Hamamatsu (JP); Yusei Nagata, Hamamatsu (JP); Shinichi Ohba, Hamamatsu (JP); Matthew Partlow, Somerville, MA (US); Ron Collins, Londonderry, NH (US); Stephen F. Horne, Medford, MA (US); Laura Owens, Arlington, MA (US)

(73) Assignees: Hamamatsu Photonics K.K., Hamamatsu (JP); Energetiq Technology, Inc., Wilmington, MA (US)

( * ) Notice: Subject to any disclaimer, the term of this patent is extended or adjusted under 35 U.S.C. 154(b) by 594 days.

(21) Appl. No.: 17/129,753

(22) Filed: Dec. 21, 2020

(65) Prior Publication Data

US 2022/0199372 A1 Jun. 23, 2022

(51) Int. Cl.
*H01J 37/32* (2006.01)
*H01J 37/075* (2006.01)
(Continued)

(52) U.S. Cl.
CPC ...... *H01J 37/32513* (2013.01); *H01J 37/075* (2013.01); *H01J 37/32009* (2013.01);
(Continued)

(58) Field of Classification Search
None
See application file for complete search history.

(56) References Cited

U.S. PATENT DOCUMENTS 4,986,214 A * 1/1991 Zumoto ............... C23C 16/517
118/723 MR
7,435,982 B2 10/2008 Smith
(Continued)

FOREIGN PATENT DOCUMENTS

EP 3540760 A1 9/2019
JP 2001/108880 A 4/2001
(Continued)

OTHER PUBLICATIONS

Makela, Maarit et al., "Thermal Atomic Layer Deposition of Continuous and Highly Conducting Gold Thin Films", Chemistry of Materials, vol. 29, No. 14, Jul. 11, 2017; pp. 6130-6136 (7 Pages), XP055531240.

(Continued)

*Primary Examiner* — Anh Q Tran
(74) *Attorney, Agent, or Firm* — Cesari and McKenna, LLP

(57) ABSTRACT

A light emitting sealed body includes a housing which stores a discharge gas in an internal space and is provided with a first window portion to which first light is incident and a second window portion from which second light is emitted. The housing includes at least one flow path which is partitioned from the internal space and extends toward at least one of the first window portion and the second window portion.

16 Claims, 17 Drawing Sheets

(51) Int. Cl.
  *H05H 1/00*  (2006.01)
  *C23C 16/455*  (2006.01)

(52) U.S. Cl.
  CPC .............. *H05H 1/00* (2013.01); *H05H 1/01* (2021.05); *C23C 16/45544* (2013.01)

(56) References Cited

U.S. PATENT DOCUMENTS

| | | | |
|---|---|---|---|
| 7,786,455 B2 | 8/2010 | Smith | |
| 7,989,786 B2 | 8/2011 | Smith et al. | |
| 8,309,943 B2 | 11/2012 | Smith et al. | |
| 8,525,138 B2 | 9/2013 | Smith et al. | |
| 8,921,814 B2 | 12/2014 | Pellemans et al. | |
| 8,969,841 B2 | 3/2015 | Smith | |
| 9,048,000 B2 | 6/2015 | Smith | |
| 9,185,786 B2 | 11/2015 | Smith | |
| 9,357,626 B2 | 5/2016 | Pellemans et al. | |
| 9,576,785 B2 | 2/2017 | Blondia | |
| 9,609,732 B2 | 3/2017 | Smith | |
| 9,646,816 B2 | 5/2017 | Asai et al. | |
| 9,741,553 B2 | 8/2017 | Blondia | |
| 9,748,086 B2 | 8/2017 | Blondia | |
| 9,775,226 B1 * | 9/2017 | Bezel ..................... | H01J 65/04 |
| 9,814,126 B2 | 11/2017 | Van Heumen | |
| 9,824,879 B2 | 11/2017 | Asai et al. | |
| 9,913,357 B2 | 3/2018 | Van Heumen | |
| 9,922,814 B2 | 3/2018 | Blondia | |
| 9,924,585 B2 | 3/2018 | Van Heumen | |
| 9,927,094 B2 | 3/2018 | Bezel et al. | |
| 9,984,865 B2 | 5/2018 | Asai et al. | |
| 10,032,622 B2 | 7/2018 | Asai et al. | |
| 10,057,973 B2 | 8/2018 | Blondia | |
| 10,109,473 B1 | 10/2018 | Blondia et al. | |
| 10,186,414 B2 | 1/2019 | Blondia | |
| 10,186,416 B2 | 1/2019 | Blondia | |
| 10,420,197 B2 | 9/2019 | Van Heumen | |
| 10,504,714 B2 | 12/2019 | Blondia | |
| 10,561,008 B2 | 2/2020 | Mori et al. | |
| 10,609,804 B2 | 3/2020 | Mori et al. | |
| 2015/0201483 A1 * | 7/2015 | Bezel ..................... | H01J 61/30 |
| | | | 250/503.1 |
| 2019/0021158 A1 | 1/2019 | Nozaki | |
| 2019/0045615 A1 | 2/2019 | Mori et al. | |
| 2019/0053364 A1 | 2/2019 | Mori et al. | |

FOREIGN PATENT DOCUMENTS

| | | | |
|---|---|---|---|
| JP | 6211912 B2 | 10/2017 | |
| JP | 6224445 B2 | 11/2017 | |
| JP | 2017-220319 A | 12/2017 | |
| JP | 2018-060640 A | 4/2018 | |
| KR | 97/0064237 A | 9/1997 | |
| KR | 2007/0028861 A | 3/2007 | |

OTHER PUBLICATIONS

Mandia, David Joseph "In-situ Optical Characterization of Noble Metal Thin Film Deposition and Development of a High-performance Plasmonic Sensor," Department of Chemistry, 2016, Carleton University; 264 Pages, XP081297861.

Wagner et al., "Ultrabroadband Nanospectroscopy with a Laser-Driven Plasma Source", ACS Photonics, Feb. 5, 2018, p. 1467-p. 1475.

Collins et al., "High Brightness Broadband Infrared Light Source, from 0.3 to 20 Microns", Energetiq Technology, Inc., Woburn, MA 01801, USA, May 5, 2019.

A Hamamatsu Company, "High Brightness Broadband Infrared Laser-Driven Light Source, from 0.3 to 20 Microns", R. Collins et al., May 5, 2019.

Mini-poster displayed at "Laser World of Photonics 2019" Jun. 24-27, 2019; Munich, Germany.

* cited by examiner

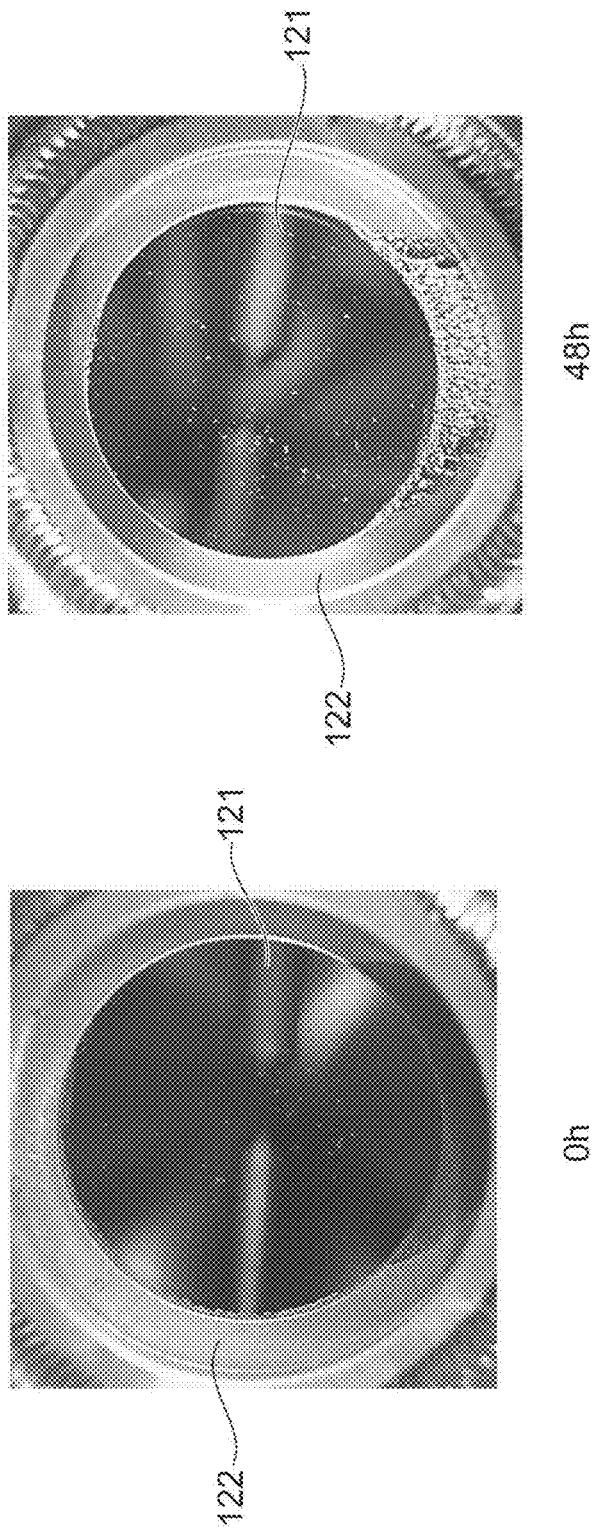

299h

93h

328h

LIGHT EMITTING SEALED BODY, LIGHT EMITTING UNIT, AND LIGHT SOURCE DEVICE

TECHNICAL FIELD

An aspect of the present disclosure relates to a light emitting sealed body, a light emitting unit, and a light source device.

BACKGROUND

A laser excitation light source is known as a light source in which plasma generated in a discharge gas is maintained by the irradiation of laser light and light from the plasma is output as output light. In a laser excitation light source described in US Patent Publication No. 2019/45615, a main body portion storing a discharge gas is provided with a light incident window through which laser light is transmitted and a light emitting window through which output light is transmitted.

SUMMARY

When the above-described laser excitation light source is continuously driven, extraneous matter on the window may become visible. The extraneous matter on the window portion may be a stain on the window portion and disturb the transmission of the laser light or the emitted light. As a result, a desired output may not be obtained and a life may be shortened. In order to improve the life of the laser excitation light source, it is required to suppress such extraneous matter.

An object of an aspect of the present disclosure is to provide a light emitting sealed body, a light emitting unit, and a light source device having an improved life.

A light emitting sealed body according to an aspect of the present disclosure includes: a housing which stores a discharge gas in an internal space and is provided with a first window portion to which first light is incident and a second window portion from which second light is emitted, in which the first light is laser light for maintaining plasma generated in the discharge gas and the second light is light from the plasma, in which the housing includes at least one extension space which is partitioned from the internal space and extends toward at least one of the first window portion and the second window portion.

In this light emitting sealed body, the housing includes at least one extension space which is partitioned from the internal space and extends toward at least one of the first window portion and the second window portion. Accordingly, for example, when a fluid is supplied to the extension space, the fluid can be supplied to at least one of the first window portion and the second window portion and the adhesion or generation of extraneous matter can be suppressed. As a result, a decrease in life due to the stain on the window portion is suppressed and the life of the light emitting sealed body can be improved.

An outer surface of the housing may be provided with at least one groove which extends toward at least one of the first window portion and the second window portion, and the extension space may be configured by the at least one groove. In this case, the extension space can be easily formed.

The at least one groove may include a pair of grooves, and the pair of grooves may be formed so as to sandwich at least one of the first window portion and the second window portion. In this case, a fluid can be efficiently supplied to at least one of the first window portion and the second window portion.

The pair of grooves may be located on the same straight line. In this case, a fluid can be further efficiently supplied to any one of the first window portion and the second window portion.

Each of the pair of grooves may be formed so as to extend from at least one of the first window portion and the second window portion to reach an edge of the outer surface of the housing. In this case, a fluid can be easily introduced into the groove portion.

The first window portion may include a first opening which is formed in the housing and a first window member that hermetically seals the first opening and transmits the first light, the second window portion may include a second opening which is formed in the housing and a second window member that hermetically seals the second opening and transmits the second light, and the extension space may be formed so as to communicate with at least one of the first opening and the second opening. In this case, a fluid can be efficiently supplied to at least one of the first window member and the second window member.

Each of the first window member and the second window member may be hermetically fixed to the housing by a joining material. In this case, each of the first window member and the second window member can be more reliably and satisfactorily fixed to the housing.

The joining material may be a metal brazing material. In this case, each of the first window member and the second window member can be further satisfactorily fixed to the housing.

The metal brazing material may be a titanium-doped silver brazing material. In this case, each of the first window member and the second window member can be still further satisfactorily fixed to the housing.

A protection layer which covers the joining material may be provided in at least one of a first joining position between the first window member and the housing and a second joining position between the second window member and the housing. In this case, the joining material can be shielded by the protection layer and, for example, oxidation of constituting elements of the joining material can be suppressed. As a result, particularly when extraneous matter is caused by constituting elements of the joining material, the adhesion or generation of extraneous matter can be suppressed. As a result, a decrease in life due to the stain on the window portion is suppressed and the life of the light emitting sealed body can be improved.

The first window portion may further include a first frame member that is hermetically fixed to the housing and the second window portion may further include a second frame member that is hermetically fixed to the housing. Then, the first window member may be hermetically joined to the first frame member and may be hermetically fixed to the housing through the first frame member and the second window member may be hermetically joined to the second frame member and may be hermetically fixed to the housing through the second frame member. In this case, each of the first window member and the second window member can be satisfactorily fixed to the housing.

A light source device according to an aspect of the present disclosure includes: the light emitting sealed body; and a light introduction unit which allows the first light to be incident into the first window portion. According to the light source device, the life of the light emitting sealed body can be improved due to the above-described reasons.

A light emitting unit according to an aspect of the present disclosure includes: a light emitting sealed body; and a casing which stores the light emitting sealed body, in which the light emitting sealed body includes a housing which stores a discharge gas and is provided with a first window portion to which first light is incident and a second window portion from which second light is emitted, in which the first light is laser light for maintaining plasma generated in the discharge gas and the second light is light from the plasma, and in which the housing is fixed to the casing, a flow path for supplying a fluid is provided between the housing and the casing, and the flow path extends toward at least one of the first window portion and the second window portion.

In the light emitting unit, a flow path which extends toward at least one of the first window portion and the second window portion is provided between the housing and the casing. Accordingly, when a fluid is supplied to the flow path, the fluid can be supplied to at least one of the first window portion and the second window portion and the adhesion or generation of extraneous matter can be suppressed. As a result, a decrease in life due to the stain on the window portion is suppressed and the life of the light emitting sealed body can be improved.

An outer surface of the housing may be provided with at least one groove formed toward at least one of the first window portion and the second window portion, and the flow path may be configured by the at least one groove. In this case, when a fluid is supplied to the groove, the fluid can be supplied to at least one of the first window portion and the second window portion and the adhesion or generation of extraneous matter can be suppressed.

An inner surface of the casing may be provided with at least one groove formed toward at least one of the first window portion and the second window portion, and the flow path may be configured by the at least one groove. In this case, when a fluid is supplied to the groove, the fluid can be supplied to at least one of the first window portion and the second window portion and the adhesion or generation of extraneous matter can be suppressed.

A light emitting sealed body according to an aspect of the present disclosure includes: a housing which stores a discharge gas and is provided with a first opening to which first light is incident and a second opening from which second light is emitted, in which the first light is laser light for maintaining plasma generated in the discharge gas and the second light is light from the plasma; a first window portion which includes a first window member allowing the first light to be transmitted therethrough and hermetically seals the first opening; and a second window portion which includes a second window member allowing the second light to be transmitted therethrough and hermetically seals the second opening, in which each of the first window member and the second window member is hermetically fixed to the housing by a joining material, and in which a protection layer which covers the joining material is provided at at least one of a first joining position between the first window member and the housing and a second joining position between the second window member and the housing.

In this light emitting sealed body, the protection layer which covers the joining material is provided in at least one of the first joining position and the second joining position. Accordingly, the joining material can be shielded by the protection layer and, for example, oxidation of constituting elements of the joining material can be suppressed. As a result, particularly when extraneous matter is caused by constituting elements of the joining material, the adhesion or generation of extraneous matter can be suppressed. As a result, a decrease in life due to the stain on the window portion is suppressed and the life of the light emitting sealed body can be improved.

The protection layer may contain a metal material. In this case, the joining material can be reliably shielded even in a high-temperature environment due to the plasma or the like.

The protection layer may be a plated layer. In this case, the joining material can be more reliably shielded even in a high-temperature environment due to the plasma or the like.

The protection layer may be an ALD layer. In this case, the joining material can be more reliably shielded even in a high-temperature environment due to the plasma or the like.

The protection layer may be an ALD layer having the same composition as that of the material forming the first window member when the protection layer is provided at the first joining position and may be an ALD layer having the same composition as that of the material forming the second window member when the protection layer is provided at the second joining position. In this case, since the ALD layer and the first window member or the second window member have the same composition, the first window member or the second window member does not need to be masked in the ALD layer forming step and the protection layer can be easily formed.

The first window portion may further include a first frame member hermetically fixed to the housing and the second window portion may further include a second frame member hermetically fixed to the housing. Then, the first window member may be hermetically joined to the first frame member and may be hermetically fixed to the housing via the first frame member and the second window member may be hermetically joined to the second frame member and may be hermetically fixed to the housing via the second frame member. In this case, each of the first window member and the second window member can be satisfactorily fixed to the housing.

A light source device according to an aspect of the present disclosure device includes the light emitting sealed body; and a light introduction unit which allows the first light to be incident into the first opening. According to the light source device, the life of the light emitting sealed body can be improved due to the above-described reasons.

According to an aspect of the present disclosure, it is possible to provide the light emitting sealed body, the light emitting unit, and the light source device having an improved life.

BRIEF DESCRIPTION OF THE DRAWINGS

FIG. 9A is a picture showing a first comparative sample immediately after an operation starts.

FIG. 9B is a picture showing the first comparative sample after 48 hours elapse.

DETAILED DESCRIPTION

Figure 1:
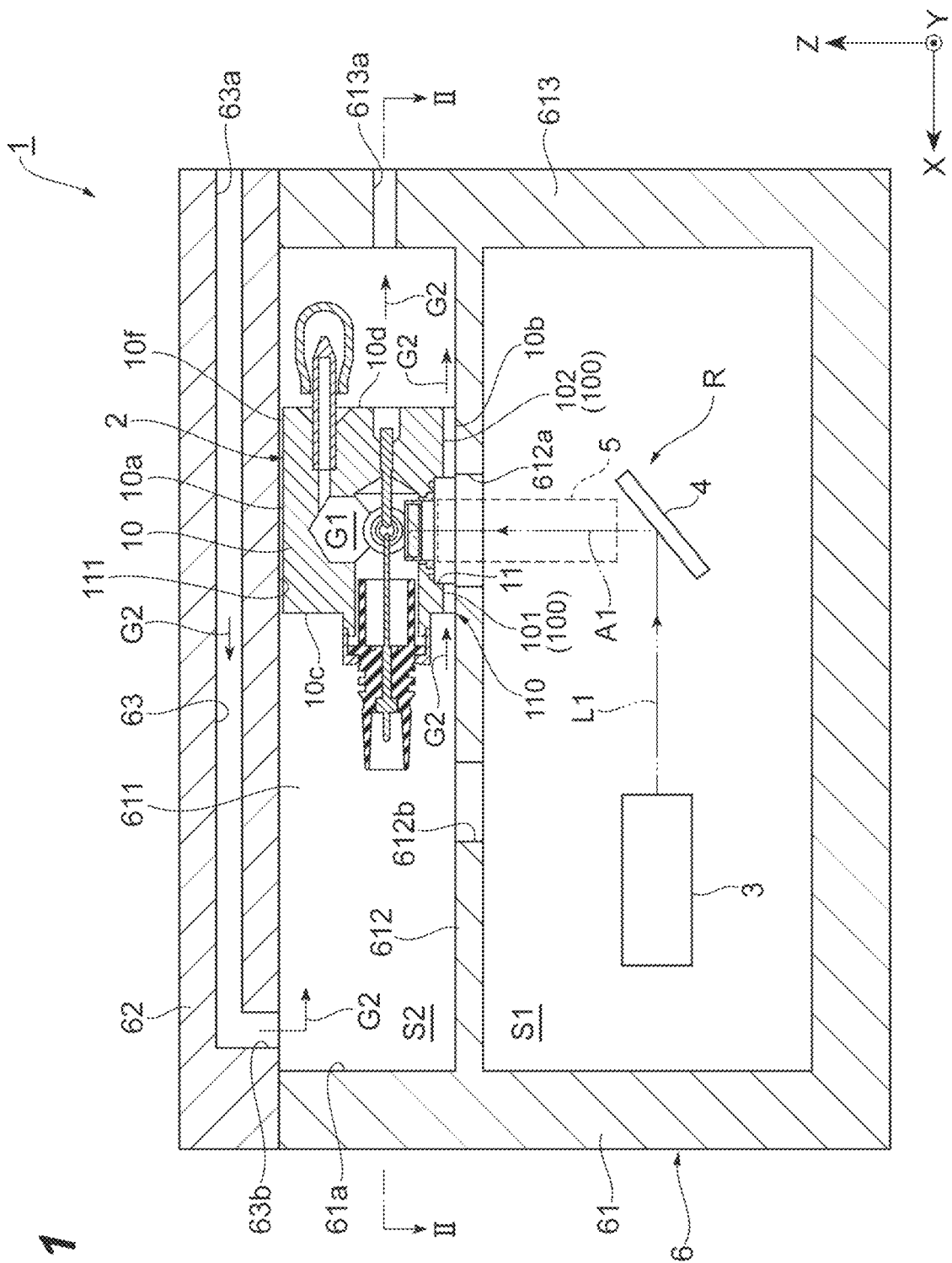
FIG. 1 is a cross-sectional view of a laser excitation light source according to a first embodiment.

Hereinafter, an embodiment of the invention will be described in detail with reference to the drawings. Additionally, in the following description, the same or corresponding components will be denoted by the same reference symbols without redundant description.

Configuration of Laser Excitation Light Source

As illustrated in FIGS. 1 to 5, a laser excitation light source (light emitting unit, light source device) 1 includes a light emitting sealed body 2, a laser light source 3, a mirror 4, an optical system 5, and a casing (lamp house) 6. The light emitting sealed body 2, the laser light source 3, the mirror 4, and the optical system 5 are stored inside the casing 6. A discharge gas G1 is enclosed in the light emitting sealed body 2. The discharge gas G1 is, for example, a xenon gas. In the laser excitation light source 1, plasma is generated in the discharge gas G1. First light L1 which is laser light for maintaining plasma is incident to the light emitting sealed body 2 and second light L2 which is light from plasma is emitted from the light emitting sealed body 2 as output light. The first light has a wavelength of, for example, about 800 nm to 1100 nm. The second light L2 is, for example, light in the mid-infrared region and has a wavelength of about 2 μm to 20 μm. The light emitting sealed body 2 will be described in detail later.

The laser light source 3 is, for example, a laser diode and outputs the first light L1 which is laser light. The mirror 4 reflects the first light L1 from the laser light source 3 toward the optical system 5. The optical system 5 includes one or plural lenses. The optical system 5 guides the first light L1 from the mirror 4 to the light emitting sealed body 2 while condensing the first light L1. The laser light source 3, the mirror 4, and the optical system 5 constitute a light introduction unit R which causes the first light L1 to be incident to a first opening 11 along a first optical axis A1. The first opening 11 and the first optical axis A1 will be described later.

The casing 6 includes a main body portion 61 and a lid member 62. A storage space S1 is formed inside the main body portion 61 and the laser light source 3, the mirror 4, and the optical system 5 are arranged inside the storage space S1. A depression 61a is formed in the main body portion 61 and an opening portion of the depression 61a is closed by the lid member 62 so as to form a storage space S2. The light emitting sealed body 2 is disposed inside the storage space S2. The main body portion 61 includes a pair of wall portions 611 which define the depression 61a and each wall portion 611 is provided with an opening 611a through which the second light L2 emitted from the light emitting sealed body 2 passes. The second light L2 passes through the opening 611a and is emitted to the outside.

The main body portion 61 includes a wall portion 612 which divides the storage space S1 and the depression 61a and the storage space S1 and the storage space S2 are divided by the wall portion 612. Further, an opening 612a is formed in the wall portion 612. A part of the optical system 5 is disposed inside the opening 612a and the first light L1 passes through the opening 612a and is incident to the light emitting sealed body 2.

A flow path 63 is formed inside the lid member 62. A gas (fluid) G2 flows in the flow path 63. The gas G2 is, for example, an inert gas such as nitrogen. The flow path 63 is connected to the outside through an opening 63a and the gas G2 is supplied from an external gas supply device (not illustrated) to the flow path 63 through the opening 63a. The flow path 63 is connected to the storage space S2 of the main body portion 61 through an opening 63b and the gas G2 flows from the flow path 63 into the storage space S2 through the opening 63b.

The gas G2 passes between the wall portion 612 of the main body portion 61 and the light emitting sealed body 2 mostly as described below and is discharged from a ventilation hole 613a to the outside. The ventilation hole 613a is a through-hole which is formed in a wall portion 613 of the main body portion 61 so as to communicate with the storage space S2. The wall portion 613 includes a pair of tapered surfaces 613b which are respectively formed at the boundary portions of the pair of wall portions 611. The pair of tapered surfaces 613b are inclined so as to be closer to each other as it goes toward the ventilation hole 613a. Each tapered surface 613b is connected to the ventilation hole 613a. The tapered surface 613b guides the gas G2 toward the ventilation hole 613a. A through-hole 612b is formed in the wall portion 612 of the main body portion 61 and a part of the gas G2 flowing from the flow path 63 to the storage space S2 passes through the through-hole 612b and flows into the storage space S1.

Configuration of Light Emitting Sealed Body

The light emitting sealed body 2 includes a housing 10, a first window portion 20, two second window portions 30, a first electrode 40, and a second electrode 50.

The housing 10 is formed in a substantially box shape by a metal material and stores the discharge gas G1 in its internal space S3. More specifically, a sealed internal space S3 is formed inside the housing 10 and the internal space S3 is filled with the discharge gas G1. As an example of the metal material forming the housing 10, stainless steel is exemplified. In this case, the housing 10 has a light shielding property with respect to the first light L1 and the second light L2. That is, the housing 10 is formed of a light shielding material which does not allow the first light L1 and the second light L2 to be transmitted therethrough.

The first opening 11 and two second openings 12 are formed in the housing 10. The first light L1 is incident to the first opening 11 along the first optical axis A1. The first opening 11 is formed in a circular shape, for example, as viewed from a direction (hereinafter, referred to as a Z-axis direction) parallel to the first optical axis A1. In this example, the first optical axis A1 passes through the center of the first opening 11 as viewed from the Z-axis direction. The first opening 11 includes an inner portion 11a, a middle portion 11b, and an outer portion 11c. The inner portion 11a opens to the internal space S3. The outer portion 11c opens to the outside. The middle portion 11b is connected to the inner portion 11a and the outer portion 11c. Each of the inner portion 11a, the middle portion 11b, and the outer portion 11c has, for example, a cylindrical shape. The diameter (outer shape) of the middle portion 11b is larger than the diameter (outer shape) of the inner portion 11a and the diameter (outer shape) of the outer portion 11c is larger than the diameter (outer shape) of the middle portion 11b. A part of the optical system 5 is disposed in the outer portion 11c.

The second light L2 is emitted from each second opening 12 along a second optical axis A2. Each second opening 12 is formed in, for example, a circular shape as viewed from a direction (hereinafter, referred to as a Y-axis direction) parallel to the second optical axis A2. In this example, the second optical axis A2 passes through the center of the second opening 12 as viewed from the Y-axis direction. Each second opening 12 includes an inner portion 12a, a middle portion 12b, and an outer portion 12c. The inner portion 12a opens to the internal space S3. The outer portion 12c opens to the outside. The middle portion 12b is connected to the inner portion 12a and the outer portion 12c. Each of the inner portion 12a, the middle portion 12b, and the outer portion 12c has, for example, a cylindrical shape. The diameter (outer shape) of the middle portion 12b is larger than the diameter (outer shape) of the inner portion 12a and the diameter (outer shape) of the outer portion 12c is larger than the diameter (outer shape) of the middle portion 12b.

The first optical axis A1 intersects the second optical axis A2 inside the internal space S3. That is, the first opening 11 and the second opening 12 are disposed so that the first optical axis A1 and the second optical axis A2 intersect each other. An intersection C between the first optical axis A1 and the second optical axis A2 is located inside the internal space S3. In this example, the first optical axis A1 perpendicularly intersects the second optical axis A2, but the first optical axis A1 may intersect the second optical axis A2 at an angle other than a right angle. The first optical axis A1 is not parallel to the second optical axis A2. The first optical axis A1 does not pass through the second opening 12 and the second optical axis A2 does not pass through the first opening 11.

The first window portion 20 hermetically seals the first opening 11. The first window portion 20 includes a first window member 21 and a first frame member 22. Note that it can be seen that the first window portion 20 includes the first opening 11, the first window member 21, and the first frame member 22 and constitutes the housing 10. The first window member 21 is formed in, for example, a circular flat plate shape by a translucent material that allows the first light L1 to be transmitted therethrough. In this example, the first window member 21 is formed of sapphire and allows light having a wavelength of 5 μm or less to be transmitted therethrough.

The first frame member 22 is formed in, for example, a frame shape by Kovar metal. The first frame member 22 is formed in a substantially cylindrical shape as a whole. The first frame member 22 includes a first portion 22a having a cylindrical shape and a second portion 22b having a cylindrical shape and integrally formed with the first portion 22a. The outer shape of the second portion 22b is larger than the outer shape of the first portion 22a.

The first window member 21 is disposed inside the first portion 22a. Specifically, a boundary portion between the inner surface of the first portion 22a and the inner surface of the second portion 22b is provided with a circular ring-shaped protrusion portion 22c which protrudes inward and the first window member 21 is disposed inside the first portion 22a while contacting the protrusion portion 22c. In this state, a side surface 21a of the first window member 21 contacts the inner surface of the first portion 22a.

The side surface 21a of the first window member 21 is hermetically joined to the inner surface of the first portion 22a over the entire circumference by a joining material (first joining material) 23. Accordingly, a gap between the first window member 21 and the first frame member 22 is hermetically sealed. The joining material 23 is, for example, a metal brazing material and is, more specifically, a titanium-doped silver brazing material. The titanium-doped silver brazing material is a brazing material composed of, for example, 70% of silver, 28% of copper, and 2% of Ti and is, for example, TB-608T manufactured by Tokyo Braze Co., Ltd.

An outer surface of the second portion 22b is provided with a circular ring-shaped flange portion 22d which protrudes outward. The first frame member 22 is fixed to the housing 10 while the flange portion 22d is disposed inside the middle portion 11b of the first opening 11. In this state, a part of the first portion 22a of the first frame member 22 protrudes from the first opening 11. The first window member 21 is disposed so as to face the intersection C between the first optical axis A1 and the second optical axis A2. In this example, the light incident surface and the light emitting surface of the first window member 21 are flat surfaces which extend so as to be perpendicular to the Z-axis direction.

Figure 4:
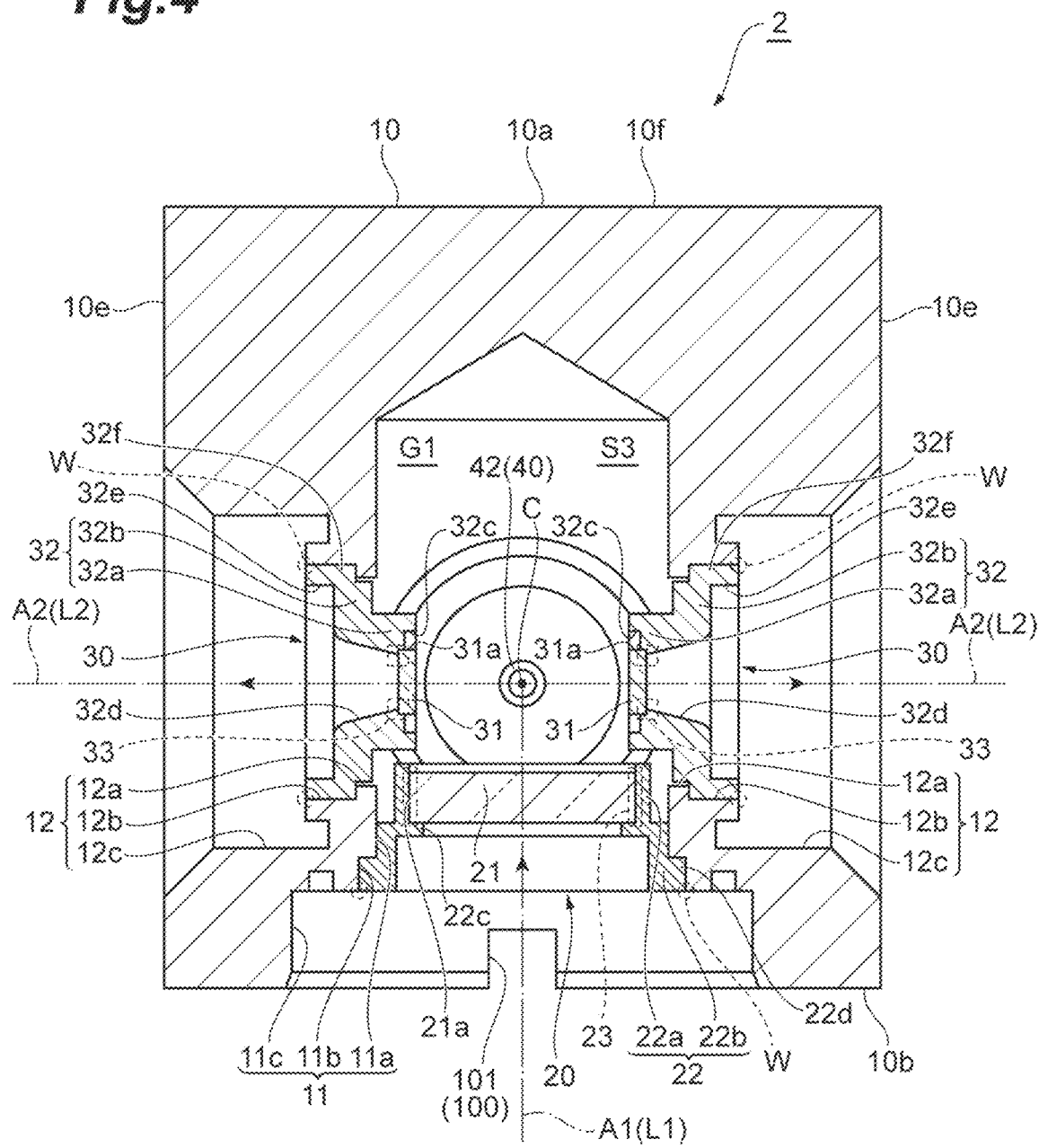
FIG. 4 is a cross-sectional view taken along line IV-IV of FIG. 3.
Figure 5:
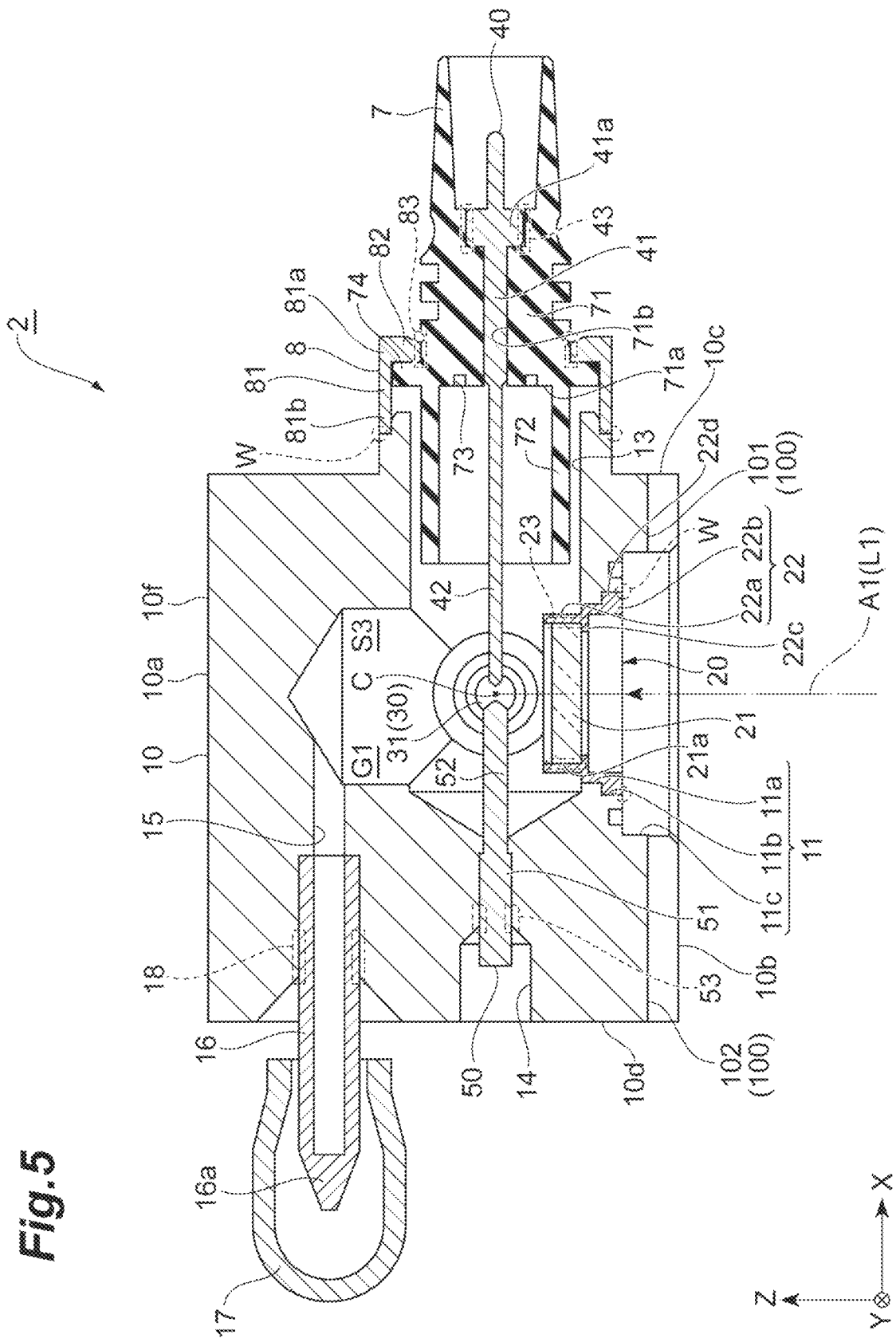
FIG. 5 is a cross-sectional view taken along line V-V of FIG. 3.

The first frame member 22 is hermetically fixed to the housing by laser welding. More specifically, a contact portion between the flange portion 22d and the inner surface of the middle portion 11b of the first opening 11 is irradiated with laser from the outside to be welded over the entire circumference, so that the first frame member 22 is hermetically joined to the housing 10. In FIGS. 4 and 5, a welded part is denoted by the sign W. Accordingly, a part between the first frame member 22 and the housing 10 is hermetically sealed. In this way, the first window member 21 is hermetically joined to the first frame member 22 by the joining material 23 and is hermetically fixed to the housing 10 via the first frame member 22. Since the first frame member 22 is interposed between the first window member 21 and the housing 10, problems caused by a difference in thermal expansion rate between the first window member 21 and the housing 10 can be suppressed.

Each second window portion 30 hermetically seals the second opening 12. Each second window portion 30 includes a second window member 31 and a second frame member 32. Note that it can be seen that the second window portion 30 includes the second opening 12, the second window member 31, and the second frame member 32 and constitutes the housing 10. The second window member 31 is formed in, for example, a circular flat plate shape by a translucent material that allows the second light L2 to be transmitted therethrough. In this example, the second window member 31 is formed of diamond and allows light having a wavelength of 20 μm or less to be transmitted therethrough.

The second frame member 32 is formed in, for example, a frame shape by Kovar metal. The second frame member 32 is formed in a substantially cylindrical shape as a whole. The second frame member 32 includes a first portion 32a having a cylindrical shape and a second portion 32b having a cylindrical shape and integrally formed with the first portion 32a. The outer shape of the second portion 32b is larger than the outer shape of the first portion 32a.

The second window member 31 is disposed inside the first portion 32a. Specifically, the first portion 32a includes an arrangement portion 32c therein and the second window member 31 is disposed inside the arrangement portion 32c. In this state, a part on the side opposite to the intersection C in the side surface 31a of the second window member 31 contacts the inner surface of the first portion 32a. A space inside the second frame member 32 further includes a middle portion 32d connected to the arrangement portion 32c and an outer portion 32e connected to the middle portion 32d. The middle portion 32d has a truncated cone shape in which a diameter (outer shape) increases when going outward. The outer portion 32e is formed in a cylindrical shape having a diameter (outer shape) larger than the middle portion 32d.

The side surface 31a of the second window member 31 is hermetically joined to the inner surface of the first portion 32a over the entire circumference by a joining material (second joining material) 33. Accordingly, a part between the second window member 31 and the second frame member 32 is hermetically sealed. The joining material 33 is, for example, a metal brazing material and is, more specifically, a titanium-doped silver brazing material.

An outer surface of the second portion 32b is provided with a circular ring-shaped flange portion 32f which protrudes outward. The second frame member 32 is fixed to the housing 10 while the flange portion 32f is disposed inside the middle portion 12b of the second opening 12. In this state, a part of the first portion 32a of the second frame member 32 protrudes from the second opening 12. The second window member 31 is disposed so as to face the intersection C between the first optical axis A1 and the second optical axis A2. In this example, the light incident surface and the light emitting surface of the second window member 31 are flat surfaces which extend so as to be perpendicular to the Y-axis direction.

The second frame member 32 is hermetically fixed to the housing by laser welding. More specifically, a contact portion between the flange portion 32f and the inner surface of the middle portion 12b of the second opening 12 is irradiated with laser from the outside to be welded over the entire circumference, so that the second frame member 32 is hermetically joined to the housing 10. Accordingly, a part between the second frame member 32 and the housing 10 is hermetically sealed. In this way, the second window member 31 is hermetically joined to the second frame member 32 by the joining material 33 and is hermetically fixed to the housing 10 through the second frame member 32. Since the second frame member 32 is interposed between the second window member 31 and the housing 10, problems caused by a difference in thermal expansion rate between the second window member 31 and the housing 10 can be suppressed.

The first electrode 40 extends along an X-axis direction (predetermined direction) which is perpendicular to both the Y-axis direction and the Z-axis direction. The first electrode 40 faces the second electrode 50 with the intersection C between the first optical axis A1 and the second optical axis A2 interposed therebetween. A distance between the intersection C and a front end of the first electrode 40 in the X-axis direction is the same as a distance between the intersection C and a front end of the second electrode 50. The first electrode 40 is formed of, for example, a metal material such as tungsten. The first electrode 40 is fixed to the housing 10 via a first insulation member 7 at the base end side thereof and is electrically separated from the housing 10. The first electrode 40 is formed in a substantially rod shape as a whole. The first electrode 40 includes a first support portion (first portion) 41 formed at a base end side and a first discharge portion (second portion) 42 located closer to the front end of the second electrode 50 than the first support portion 41. The first discharge portion 42 has a diameter smaller than that of the first support portion 41 and has a pointed shape. A boundary portion between the first support portion 41 and the first discharge portion 42 is provided with a tapered portion 42s. The tapered portion 42s has a surface which is inclined so that a diameter increases as it goes toward the first support portion 41. The tapered portion 42s is disposed at a positional relationship that forms a recess with respect to a surface 71a of a main body portion 71 to be described later. The first support portion 41 is a middle portion (a part) of the first electrode 40 in the X-axis direction. An end portion 41a at a base end side opposite to the first discharge portion 42 in the first support portion 41 is formed so as to be thicker than a portion other than the end portion 41a. The first discharge portion 42 is formed in a rod shape and is disposed inside the housing 10 (that is, inside the internal space S3).

The first insulation member 7 includes the main body portion 71 and a cylindrical portion 72. The first insulation member 7 is formed of, for example, an insulating material such as alumina (aluminum oxide) or ceramic. The main body portion 71 is formed in, for example, a columnar shape and holds the first support portion 41 of the first electrode 40. The main body portion 71 includes the surface 71a perpendicular to the X-axis direction. The surface 71a is a surface exposed to the internal space S3. The surface 71a is provided with an insertion hole 71b which penetrates the main body portion 71 in the X-axis direction and the first support portion 41 is disposed inside the insertion hole 71b and is fixed. The cylindrical portion 72 is formed in a cylindrical shape so as to extend along the X-axis direction from the surface 71a of the main body portion 71 and surrounds a part at the side (the base end side) of the first support portion 41 in the first discharge portion 42.

The end portion 41a of the first support portion 41 is hermetically joined to the inner surface of the insertion hole 71b over the entire circumference by a joining material 43. Accordingly, a gap between the first electrode 40 and the first insulation member 7 is hermetically sealed. The joining material 43 is, for example, a metal brazing material and is, more specifically, a titanium-doped silver brazing material.

The surface 71a of the main body portion 71 is roughened. In this embodiment, the surface 71a is roughened by forming a depression 73 in the surface 71a. The depression 73 extends in a circular ring shape so as to surround the first discharge portion 42 as viewed from the X-axis direction. The depression 73 is disposed so as to be separated from each of the first electrode 40 and the cylindrical portion 72. The shape of the depression 73 in a cross-section parallel to the X-axis direction is, for example, a rectangular shape.

The first insulation member 7 is hermetically fixed to the housing 10 via a connection member 8. An outer surface of the main body portion 71 of the first insulation member 7 is provided with a circular ring-shaped flange portion 74 which protrudes outward. The connection member 8 is formed of a metal material such as stainless steel. The connection member 8 includes a first portion 81 having a cylindrical shape and a second portion 82 having a ring-shaped flat plate shape and extending from a first end portion 81a of the first portion 81 inward in the radial direction. A front end of the second portion 82 contacts the outer surface of the main body portion 71. The flange portion 74 contacts the first portion 81 and the second portion 82.

The second portion 82 of the connection member 8 is hermetically joined to the outer surface of the main body portion 71 of the first insulation member 7 over the entire circumference by a joining material 83. Accordingly, a part between the connection member 8 and the first insulation member 7 is hermetically sealed. The joining material 83 is, for example, a metal brazing material and is, more specifically, a titanium-doped silver brazing material.

The connection member 8 is hermetically fixed to the housing 10 by laser welding. More specifically, a third opening 13 is formed in the housing 10. The cylindrical portion 72 of the first insulation member 7 is disposed inside the third opening 13 while being apart from the third opening 13. The connection member 8 is disposed so that a second end portion 81b of the first portion 81 contacts an opening edge of the third opening 13. A contact portion between the first portion 81 and the opening edge of the third opening 13 is irradiated with laser from the outside to be welded over the entire circumference, so that the connection member 8 is hermetically joined to the housing 10. Accordingly, a part between the connection member 8 and the housing 10 is hermetically sealed. In this way, the first insulation member 7 is hermetically joined to the connection member 8 and is hermetically fixed to the housing 10 via the connection member 8. In this state, the first electrode 40 extends so as to penetrate the third opening 13. The third opening 13 is hermetically sealed by the first electrode 40, the first insulation member 7, and the connection member 8. The connection member 8 can also be regarded as forming a part of the housing 10.

The second electrode 50 extends along the X-axis direction. The front end of the second electrode 50 faces the first electrode 40 with the intersection C between the first optical axis A1 and the second optical axis A2 interposed therebetween. The second electrode 50 is formed of, for example, a metal material such as tungsten. The second electrode 50 is electrically connected to the housing 10. The second electrode 50 is formed in a substantially rod shape having diameter larger than that of the first electrode 40 as a whole. The second electrode 50 includes a second support portion 51 formed at a base end side and a second discharge portion 52 located closer to the front end of the first electrode 40 than the second support portion 51 and having a pointed shape. The second support portion 51 is a middle portion (a part) of the second electrode 50 in the X-axis direction. The second discharge portion 52 is formed in a rod shape and is disposed inside the housing 10 (that is, inside the internal space S3).

A fourth opening 14 is formed in the housing 10. The second support portion 51 of the second electrode 50 is disposed inside the fourth opening 14 so that an outer surface of the second support portion 51 contacts the inner surface of the fourth opening 14. The second support portion 51 is hermetically joined to the inner surface of the fourth opening 14 over the entire circumference by a joining material 53. Accordingly, a part between the second electrode 50 and the housing 10 is hermetically sealed. The joining material 53 is, for example, a metal brazing material and is, more specifically, a titanium-doped silver brazing material.

The housing 10 is provided with an enclosing hole 15 for enclosing the discharge gas G1 in the internal space S3. An enclosing tube 16 is connected to the enclosing hole 15. The enclosing tube 16 is formed of, for example, a metal material such as copper. An end portion 16a opposite to the enclosing hole 15 in the enclosing tube 16 is sealed. A protection member 17 is attached to the enclosing tube 16 so as to cover the sealed end portion 16a. The protection member 17 is formed of, for example, a resin material such as rubber.

An outer surface of the enclosing tube 16 is joined to the inner surface of the enclosing hole 15 over the entire circumference by a joining material 18.

Accordingly, a part between the enclosing tube 16 and the housing 10 is hermetically sealed. The joining material 18 is, for example, a metal brazing material and is, more specifically, a titanium-doped silver brazing material. When enclosing the discharge gas G1, for example, the discharge gas G1 is introduced into the internal space S3 through the enclosing tube 16 and the end portion 16a of the enclosing tube 16 is sealed by pressing and cutting (cutting out) the enclosing tube 16 while crushing the enclosing tube 16. Then, the protection member 17 is attached to the enclosing tube 16. Such a direct enclosing method is advantageous in the following points compared to a trap method using liquid nitrogen. That is, in the trap method, there is concern that the window member may be distorted when liquid nitrogen is placed in the light emitting sealed body. In the direct enclosing method, such a situation can be suppressed. Further, a variation in enclosing pressure may be generated in the trap method, but such a variation can be suppressed in the direct enclosing method. The trap method may be used when enclosing the discharge gas in a glass bulb.

In the light emitting sealed body 2, the internal space S3 is defined by the housing 10, the first window portion 20, and the second window portion 30. In the light emitting sealed body 2, the internal space S3 is also defined by the first electrode 40, the second electrode 50, the first insulation member 7, the connection member 8, and the enclosing tube 16. The entire internal space S3 is filled with the discharge gas G1. That is, the internal space S3 is filled with the discharge gas G1. The discharge gas G1 contacts the first window member 21, the first frame member 22, the second window member 31, and the second frame member 32. The enclosing pressure (the maximal enclosing pressure) of the discharge gas G1 is, for example, about 5 MPa (50 atm). The light emitting sealed body 2 can withstand an internal pressure of 15 MPa or more.

Operation Example of Laser Excitation Light Source

In the laser excitation light source 1, a negative voltage pulse is applied to the first electrode 40 by a voltage application circuit (a voltage application unit) (not illustrated) disposed inside the casing 6 using the second electrode 50 as a ground potential. Accordingly, electrons are discharged from the first electrode 40 toward the second electrode 50. As a result, an arc discharge is generated and plasma is generated in a gap (intersection C) between the first electrode 40 and the second electrode 50. This plasma is irradiated with the first light L1 from the light introduction unit R through the first window member 21. Accordingly, the generated plasma is maintained. The second light L2 which is the light from the plasma is emitted as the output light to the outside through the second window member 31. In the laser excitation light source 1, the second light L2 is emitted from two second window members 31 toward both sides of the Y-axis direction. A positive voltage pulse which is a trigger voltage for generating plasma may be applied to the first electrode 40. In this case, electrons are discharged from the second electrode 50 toward the first electrode 40.

Detailed Configuration of Housing

Figure 6:
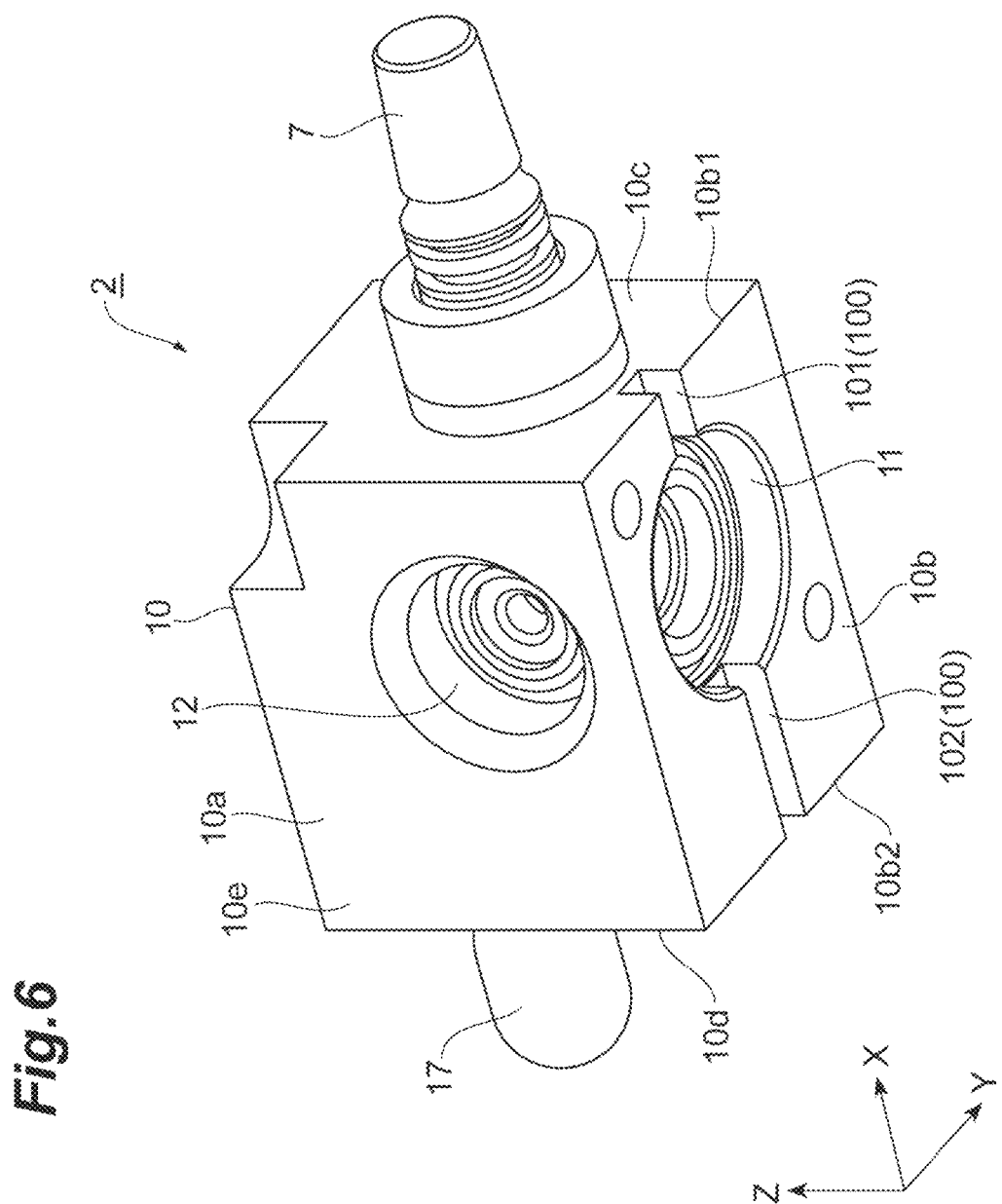
FIG. 6 is another perspective view of the light emitting sealed body.

As illustrated in FIG. 6, an outer surface 10*a* of the housing 10 is provided with at least one groove (extension space) 100 which communicates with the first opening 11. The groove 100 is partitioned from the internal space S3 of the housing 10 and extends toward the first window portion 20. That is, the groove 100 does not communicate with the internal space S3 and is separated from the internal space S3. The groove 100 is formed in the surface 10*b* provided with the first opening 11 in the outer surface 10*a*. The surface 10*b* is a flat surface perpendicular to the Z-axis direction. At least one groove 100 includes a first groove 101 and a second groove 102.

The first groove 101 and the second groove 102 are formed on both sides of the first opening 11 in the X-axis direction so as to sandwich the first window portion 20. That is, the first groove 101 faces the second groove 102 with the first opening 11 interposed therebetween in the X-axis direction and extends in the direction substantially coaxial with the second groove 102. Each of the first groove 101 and the second groove 102 is connected to the first opening 11. Each of the first groove 101 and the second groove 102 extends toward the first window portion 20 and its end portion opens to the first opening 11. Each of the first groove 101 and the second groove 102 extends in a straight shape along the X-axis direction. The first groove 101 and the second groove 102 are located on the same straight line parallel to the X-axis direction. The first groove 101 extends from the first opening 11 so as to reach one outer edge 10*b*1 of the surface 10*b* and opens to the surface 10*c* of the housing 10. The second groove 102 extends from the first opening 11 so as to reach the other outer edge 10*b*2 of the surface 10*b* and opens to the surface 10*d* of the housing 10. The surfaces 10*c* and 10*d* are surfaces which are continuous with the surface 10*b* and are surfaces on both sides of the housing 10 in the X-axis direction. The surface 10*c* is provided with the third opening 13 and the surface 10*d* is provided with the fourth opening 14 and the enclosing hole 15.

Each of the first groove 101 and the second groove 102 is formed in, for example, a rectangular shape as viewed from the Z-axis direction. The shapes of the first groove 101 and the second groove 102 in the cross-section perpendicular to the X-axis direction are the same and are, for example, rectangular. That is, each of the first groove 101 and the second groove 102 is a groove having a substantially rectangular parallelepiped internal space. The length of the second groove 102 in the X-axis direction is longer than the length of the first groove 101 in the X-axis direction.

Figure 2:
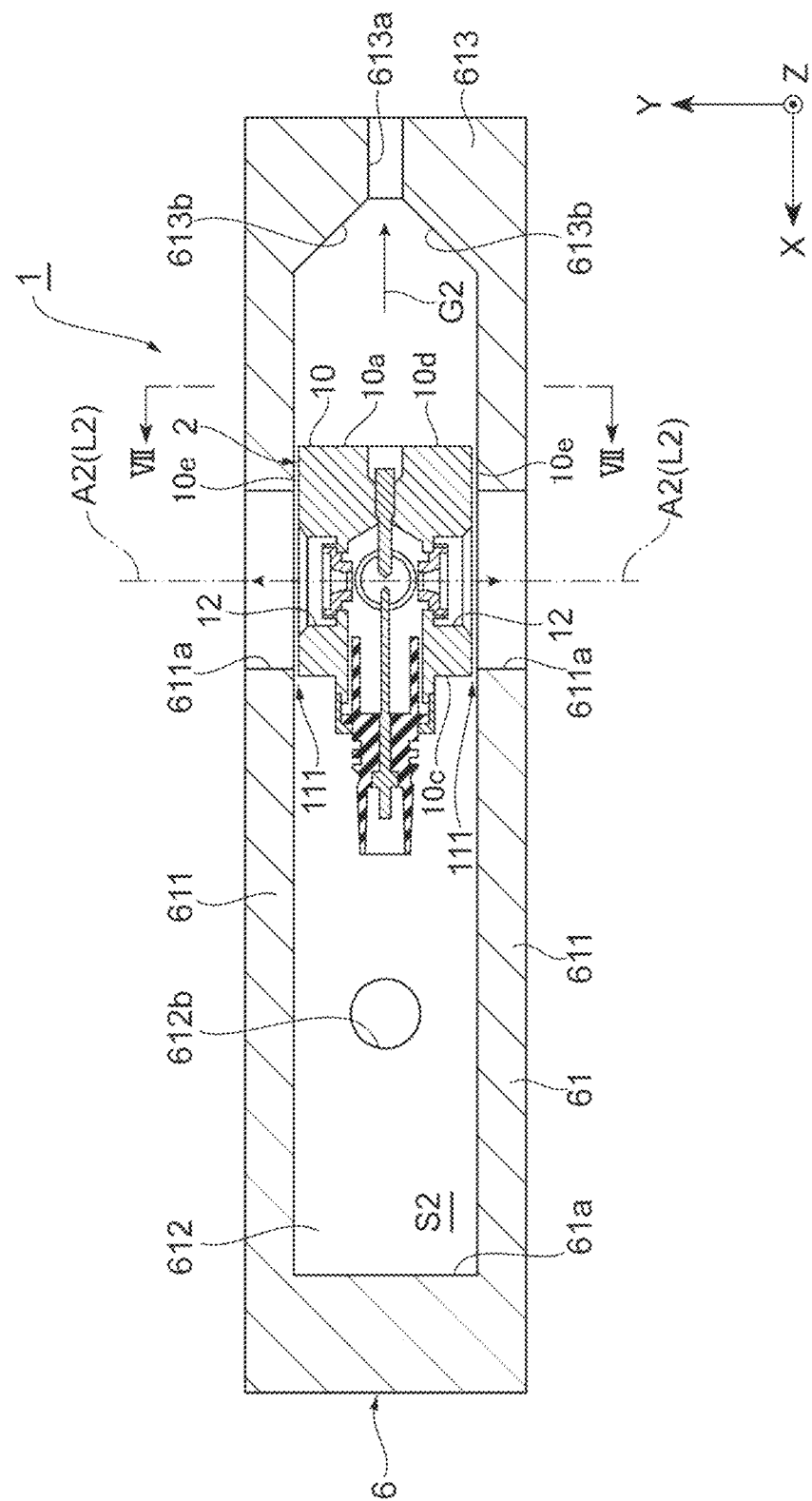
FIG. 2 is a cross-sectional view taken along line II-II of FIG. 1.
Figure 3:
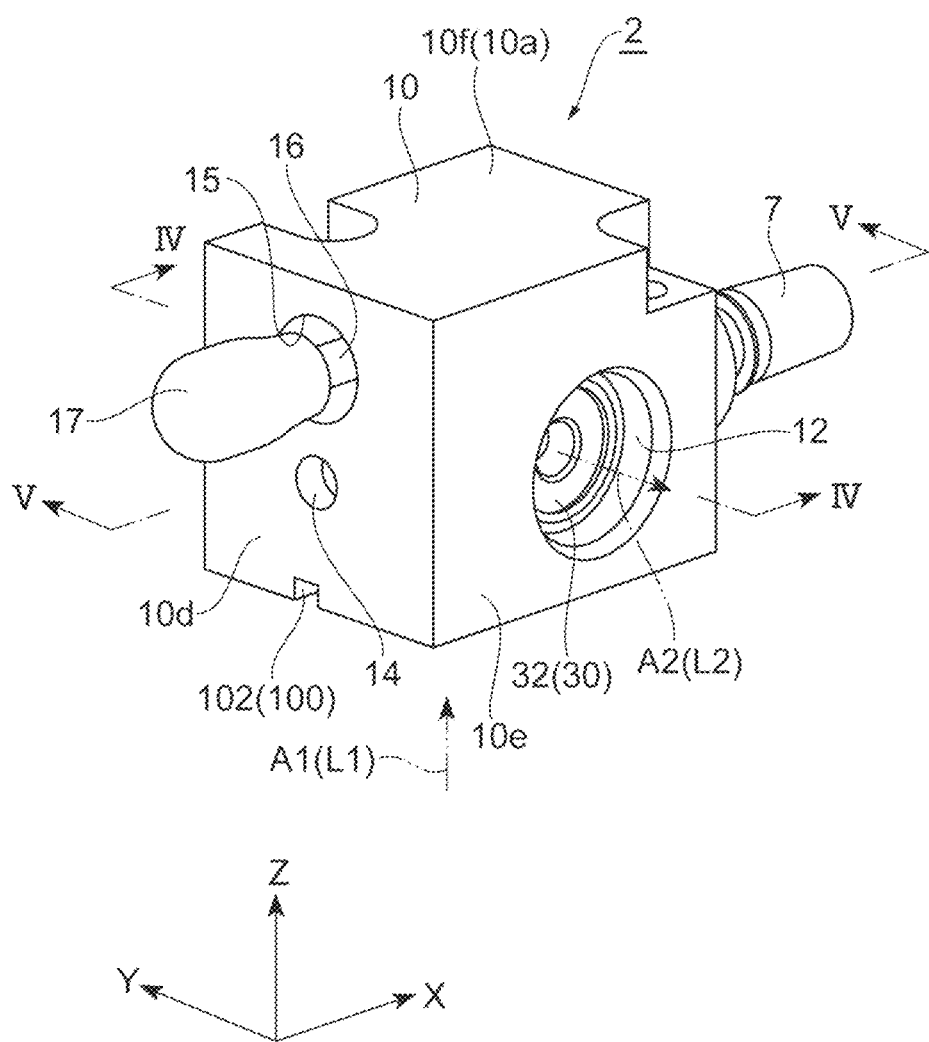
FIG. 3 is a perspective view of a light emitting sealed body according to the first embodiment.
Figure 7:
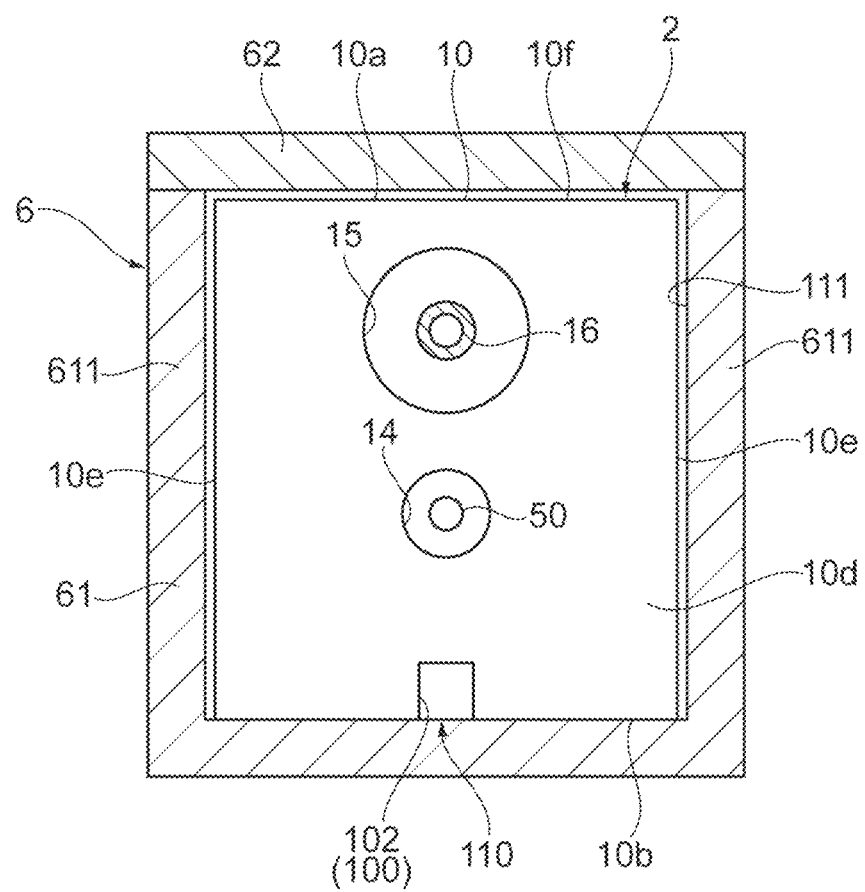
FIG. 7 is a cross-sectional view taken along line VII-VII of FIG. 2.

As illustrated in FIGS. 1, 2, and 7, the light emitting sealed body 2 is disposed in the storage space S2 of the casing 6 and is fixed to the casing 6. In this state, the surface 10*b* of the housing 10 is in contact with a wall portion 612 of the main body portion 61. On the other hand, a pair of surfaces 10*e* of the housing 10 are separated from the wall portion 611 of the main body portion 61 with a slight gap. A surface 10*f* of the housing 10 is also separated from the lid member 62 with a slight gap. The pair of surfaces 10*e* are surfaces on both sides of the housing 10 in the Y-axis direction and the surface 10*f* is a surface on the side opposite to the surface 10*b* in the Z-axis direction. Each surface 10*e* is provided with the second opening 12 of the second window portion 30. The outer surface 10*a* of the housing 10 includes the surfaces 10*b*, 10*c*, 10*d*, 10*e*, and 10*f*.

Since the groove 100 is provided, a flow path 110 for flowing the gas G2 is formed between the housing 10 and the casing 6. More specifically, the flow path 110 is formed between the surface 10*b* of the housing 10 and the wall portion 612 of the main body portion 61 by the opening portion of the groove 100 being closed by the wall portion 612 of the main body portion 61. The flow path 110 is formed by the groove 100 and communicates with the first opening 11. Further, a gap between the surfaces 10*e* and 10*f* of the housing 10 and the casing 6 also functions as a flow path 111 through which the gas G2 flows since each of the surfaces is separated from the main body portion 61 or the lid member 62 with a slight gap. For that reason, the gas G2 can also flow into the second opening 12 of the second window portion 30.

As illustrated in FIG. 1, the gas G2 supplied from the flow path 63 to the storage space S2 flows into the flow path 110. The gas G2 flows through the flow path 110 and then is discharged from the ventilation hole 613*a* to the outside. When flowing through the flow path 110, the gas G2 flows through the first groove 101, the first opening 11, and the second groove 102 in this order. Accordingly, the gas G2 inside the first opening 11 which is in contact with the first window member 21 is replaced by a newly supplied gas G2. That is, the gas supply device described above supplies the gas G2 to the flow path 63 so that the gas G2 flows through the first groove 101, the first opening 11, and the second groove 102 in this order during the operation of the laser excitation light source 1. The main body portion 61 and the lid member 62 are configured so that the gas G2 supplied from the gas supply device flows through the first groove 101, the first opening 11, and the second groove 102 in this order.

As illustrated in FIGS. 1 and 2, the gas G2 supplied from the flow path 63 to the storage space S2 flows into the flow path 111. The gas G2 flows through the flow path 111 and then is discharged from the ventilation hole 613*a* to the outside. When flowing through the flow path 111, the gas G2 flows while contacting the surfaces 10*e* and 10*f* of the housing 10. Accordingly, particularly, the gas G2 inside the second opening 12 which is in contact with the second window member 31 is replaced by a newly supplied gas G2. That is, the gas supply device described above supplies the gas G2 to the flow path 63 so that the gas G2 flows through the flow path 111 during the operation of the laser excitation light source 1. The main body portion 61 and the lid member 62 are configured so that the gas G2 supplied from the gas supply device flows through the flow path 111.

Function and Effect

In the light emitting sealed body 2, the housing 10 includes the extension space (the groove 100) which is partitioned from the internal space S3 and extends toward the first window portion 20. Accordingly, for example, when the gas G2 flows to the extension space (the groove 100), the gas G2 can flow to the first window portion 20 and the adhesion or generation of extraneous matter (for example, extraneous matter caused by oxidation of constituting elements of the joining material 23) can be suppressed. As a result, for example, since it is possible to suppress that constituting elements of the joining material 23 are deposited as extraneous matter, it is possible to suppress a decrease in life caused by the stain of the first window portion 20 and to improve the life of the light emitting sealed body 2.

The outer surface 10a of the housing 10 is provided with a groove 100 which extends toward the first window portion 20 and the extension space is configured by the groove 100. Accordingly, the extension space can be easily formed.

The groove 100 includes a first groove 101 and a second groove 102 which are formed so as to sandwich the first window portion 20. Accordingly, the gas G2 can efficiently flow to the first window portion 20.

The first groove 101 and the second groove 102 are located on the same straight line. Accordingly, the gas G2 can further efficiently flow to the first window portion 20.

The first groove 101 and the second groove 102 extend from the first window portion 20 so as to reach the outer edges 10b1 and 10b2 of the surface 10b. Accordingly, the introduction of the gas G2 to the groove 100 is facilitated.

The first window portion 20 includes the first opening 11 formed in the housing 10 and the first window member 21 hermetically sealing the first opening 11 and the groove 100 is formed so as to communicate with the first opening 11. Accordingly, the gas G2 can efficiently flow to the first window member 21.

Each of the first window member 21 and the second window member 31 is hermetically fixed to the housing 10 by the joining material 23. Accordingly, each of the first window member 21 and the second window member 31 can be more reliably and satisfactorily fixed to the housing 10.

The joining material 23 is a metal brazing material. Accordingly, each of the first window member 21 and the second window member 31 can be further satisfactorily fixed to the housing 10.

The metal brazing material is a titanium-doped silver brazing material. Accordingly, each of the first window member 21 and the second window member 31 can be still further satisfactorily fixed to the housing 10.

The first window member 21 is hermetically joined to the first frame member 22 and is hermetically fixed to the housing 10 via the first frame member 22 and the second window member 31 is hermetically joined to the second frame member 32 and is hermetically fixed to the housing 10 via the second frame member 32. Accordingly, each of the first window member 21 and the second window member 31 can be satisfactorily fixed to the housing 10.

In the laser excitation light source (the light emitting unit) 1, the flow path 110 extending toward the first window portion 20 and allowing the gas G2 to flow therethrough and the flow path 111 extending toward the second window portion 30 and allowing the gas G2 to flow therethrough are provided between the housing 10 and the casing 6. Accordingly, when the gas G2 flows to the flow paths 110 and 111, the gas G2 can flow to the first window portion 20 and the second window portion 30 and the adhesion or generation of extraneous matter can be suppressed. As a result, it is possible to suppress a decrease in life due to the stain of the first window portion 20 and the second window portion 30 and to improve the life of the light emitting sealed body 2.

The outer surface 10a of the housing 10 is provided with the groove 100 extending toward the first window portion 20 and the flow path 110 is configured by the groove 100. Accordingly, when the gas G2 flows to the groove 100, the gas G2 can flow to the first window portion 20 and the adhesion or generation of extraneous matter can be suppressed.

Second Embodiment

Figure 8:
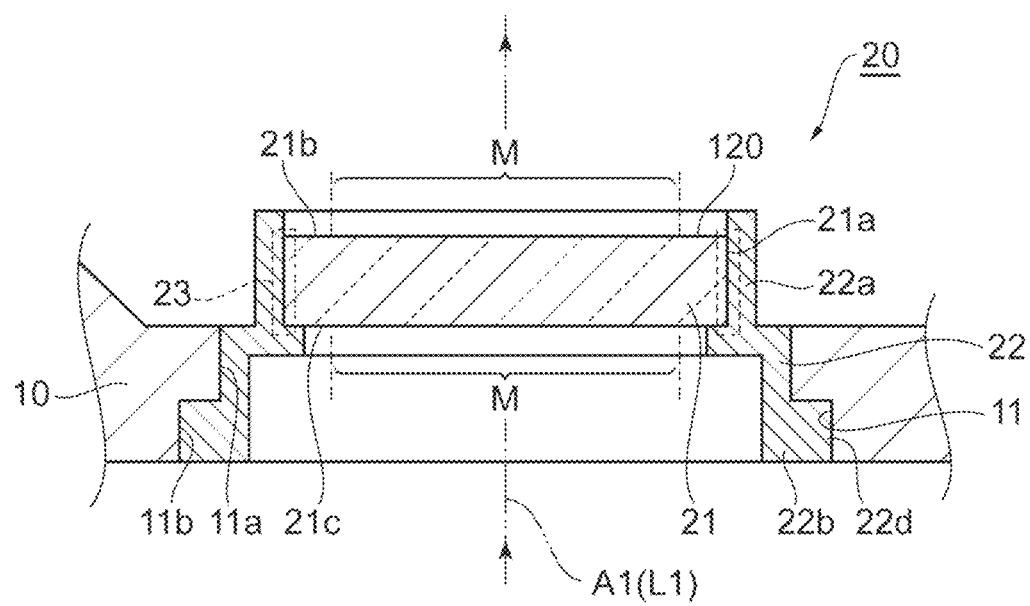
FIG. 8 is a cross-sectional view of a laser excitation light source according to a second embodiment.

The laser excitation light source 1 according to a second embodiment will be described with reference to FIG. 8. In the second embodiment, a protection layer 120 is provided at a joining position (a first joining position) between the first window member 21 and the housing 10. The outer surface 10a of the housing 10 is not provided with the groove 100 (not illustrated). The second embodiment has the same configuration as that of the first embodiment except for these points.

As described above, the side surface 21a of the first window member 21 is joined to the inner surface of the first portion 22a of the first frame member 22 by the joining material 23. In the second embodiment, the protection layer 120 is formed on the entire surface of a region other than a region M in the exposed surfaces of the first window member 21 and the first frame member 22. The exposed surfaces are surfaces other than a contact surface in the surfaces of the first window member 21 and the first frame member 22. The region M is set for each of the light emitting surface 21b and the light incident surface 21c of the first window member 21. The region M is, for example, a circular region and is a light transmission region with respect to the first light L1.

The protection layer 120 covers the joining material 23 so that the joining material 23 does not contact an external atmosphere (the discharge gas G1 and external air) surrounding the joining material 23. The protection layer 120 covers the joining material 23 over the entire circumference in each of the side of the light emitting surface 21b and the side of the light incident surface 21c. Accordingly, the protection layer 120 shields the joining material 23 from the external atmosphere. The protection layer 120 is a plated layer containing a metal material and formed of, for example, nickel. The protection layer 120 may be a plated layer formed of tin, zinc, or copper. The thickness of the protection layer 120 is, for example, about 10 μm to 15 μm. The region M is set so that the first optical axis A1 passes through the region M. Since the protection layer 120 is not provided in the region M, the first light L1 can be transmitted through the first window member 21 along the first optical axis A1.

The first window portion 20 including the protection layer 120 is formed by, for example, the following steps. First, the first window member 21 is joined to the first frame member 22 by the joining material 23. Next, a mask layer is formed in the region M. Then, the protection layer 120 is formed in a region other than the region provided with the mask layer by electroless plating while using the mask layer as a mask. Subsequently, the mask layer is removed. Accordingly, the first window portion 20 provided with the protection layer 120 can be obtained.

As described above, in the light emitting sealed body 2 of the second embodiment, the protection layer 120 which covers the joining material 23 is provided at the joining position between the first window member 21 and the housing 10. Accordingly, the joining material 23 can be shielded by the protection layer 120 and, for example, oxidation of constituting elements of the joining material 23 can be suppressed. As a result, since it is possible to suppress that constituting elements of the joining material 23 are deposited as extraneous matter, it is possible to suppress a decrease in life caused by the stain of the first window portion 20 and to improve the life of the light emitting sealed body 2.

Modified Example of Second Embodiment

In the above-described example, the protection layer 120 is a plated layer formed by plating, but as a modified example, the protection layer 120 may be an ALD layer (ALD coating) formed by atomic layer deposition (ALD). The protection layer 120 may be an ALD layer having the same composition as that of the material forming the first window member 21. For example, when the first window member 21 is formed of sapphire, the protection layer 120 may be formed of alumina. Both of sapphire and alumina have a composition of $Al_2O_3$. In this modified example, the protection layer 120 is formed on the entire surface of the exposed surfaces of the first window member 21 and the first frame member 22. Since the protection layer 120 has the same composition as that of the material forming the first window member 21, the first light L1 can be transmitted through the protection layer 120. For that reason, the protection layer 120 can be formed on the entire surface of the exposed surfaces of the first window member 21 and the first frame member 22. As a result, the mask layer forming step can be omitted in the ALD layer forming step and the ALD layer forming step can be facilitated.

Also in such a modified example, similarly to the second embodiment, the joining material 23 can be shielded by the protection layer 120 and, for example, oxidation of constituting elements of the joining material 23 can be suppressed. As a result, since it is possible to suppress that constituting elements of the joining material 23 are deposited as extraneous matter, it is possible to suppress a decrease in life caused by the stain of the first window portion 20 and to improve the life of the light emitting sealed body 2.

Effect Confirmation Test

Figure 10B:
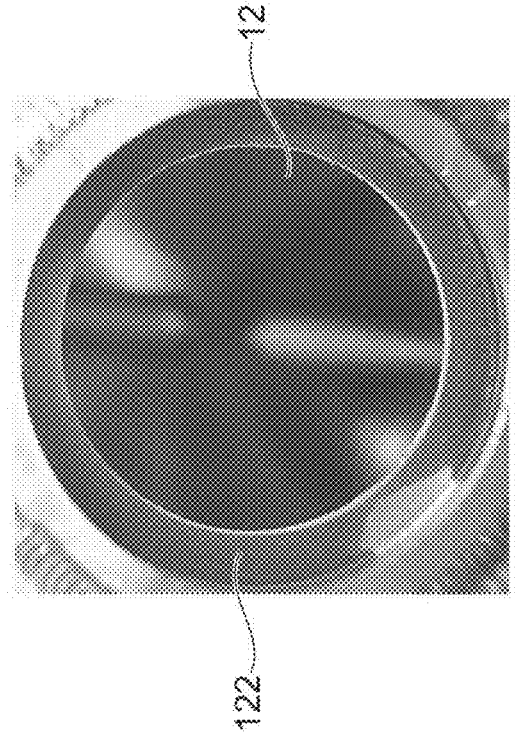
FIG. 10B is a picture showing the second comparative sample after 79 hours elapse.
Figure 10A:
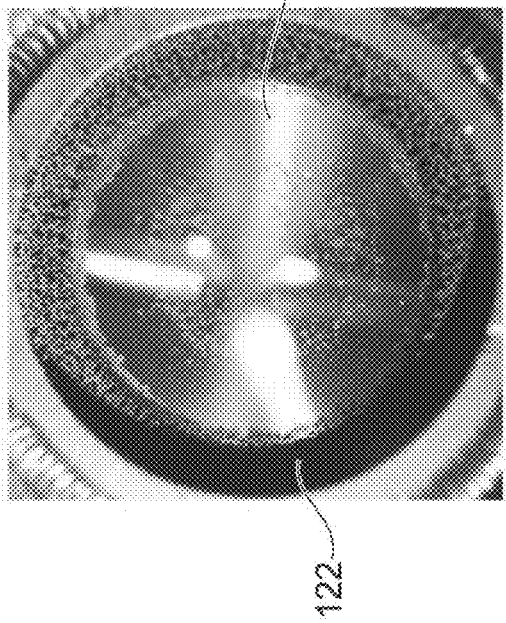
FIG. 10A is a picture showing a second comparative sample immediately after an operation starts.
Figure 11A:
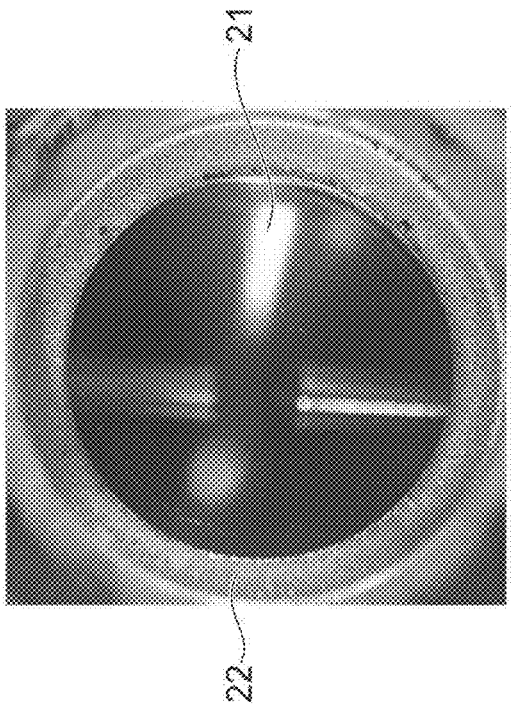
FIG. 11A is a picture showing a first implementation sample immediately after an operation starts.
Figure 11B:
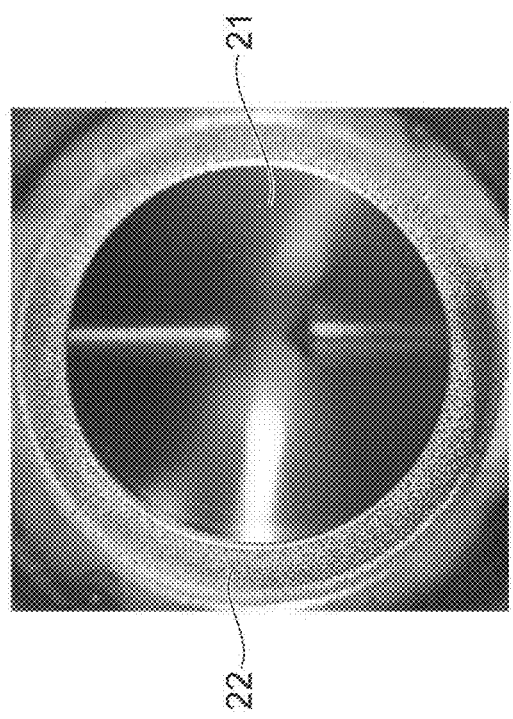
FIG. 11B is a picture showing the first implementation sample after 50 hours elapse.
Figure 12A:
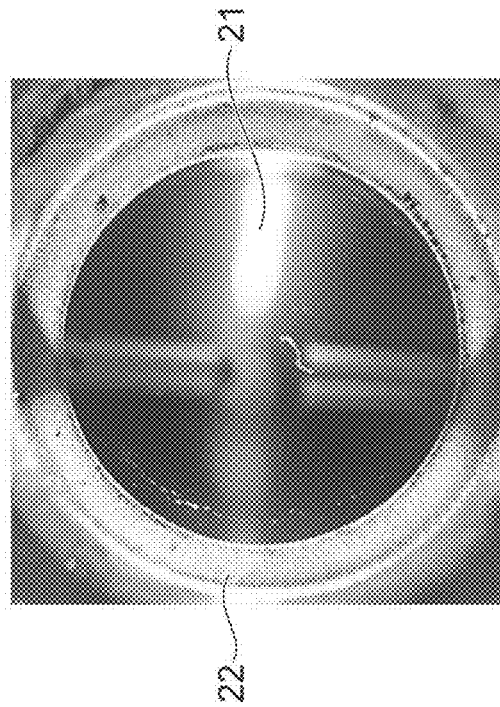
FIG. 12A is a picture showing the first implementation sample after 144 hours elapse.
Figure 12B:
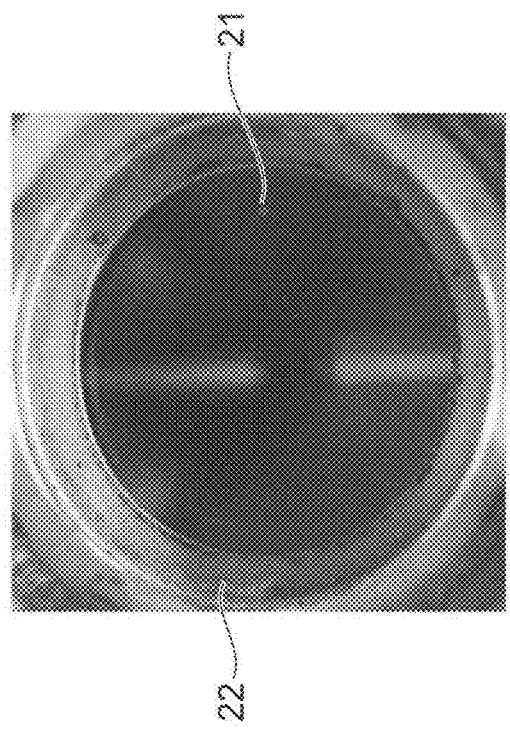
FIG. 12B is a picture showing the first implementation sample after 188 hours elapse.
Figure 13:
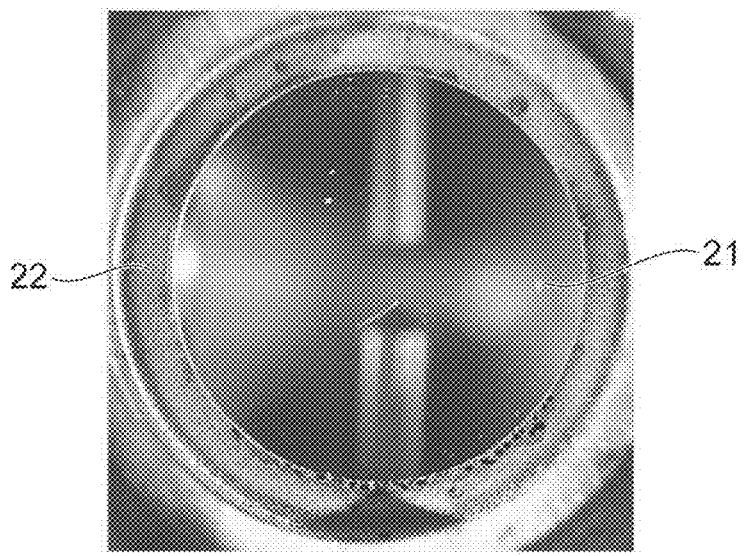
FIG. 13 is a picture showing the first implementation sample after 299 hours elapse.

FIGS. 9A and 9B show a result for a first comparative sample and FIGS. 10A and 10B show a result for a second comparative sample. The first comparative sample and the second comparative sample correspond to a configuration in which the outer surface 10a of the housing 10 is not provided with the groove 100 and the protection layer 120 is not provided at the joining position between the first window member 21 and the housing 10.

As shown in FIGS. 9A and 9B, in the first comparative sample, extraneous matter was deposited on the surfaces of the window member 121 and the frame member 122 after 48 hours elapsed from the start of the operation. As shown in FIGS. 10A and 10B, in the second comparative sample, extraneous matter was deposited on the surfaces of the window member 121 and the frame member 122 after 79 hours elapsed from the start of the operation.

The extraneous matter contained constituting elements (silver and copper) of the joining material (titanium-doped silver brazing material) for joining the window member 121 and the frame member 122 to each other. It is considered that moisture existing in external air or ozone or the like generated when oxygen contacts UV rays contributes to the generation of extraneous matter.

FIGS. 11A to 13 show a result for a first implementation sample. The first implementation sample corresponds to the configuration of the second embodiment in which the plated layer formed of nickel is provided as the protection layer 120. As shown in FIGS. 11A to 13, in the first implementation sample, extraneous matter was not deposited on the surfaces of the first window member 21 and the first frame member 22 even at the time point after 299 hours from the start of the operation. From this result, it is known that the deposition of extraneous matter can be suppressed by providing the protection layer 120.

Figure 14A:
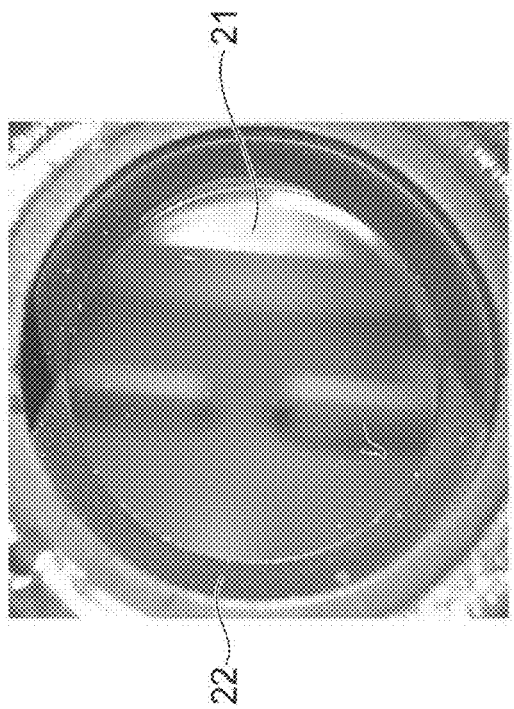
FIG. 14A is a picture showing a second implementation sample immediately after an operation starts.
Figure 14B:
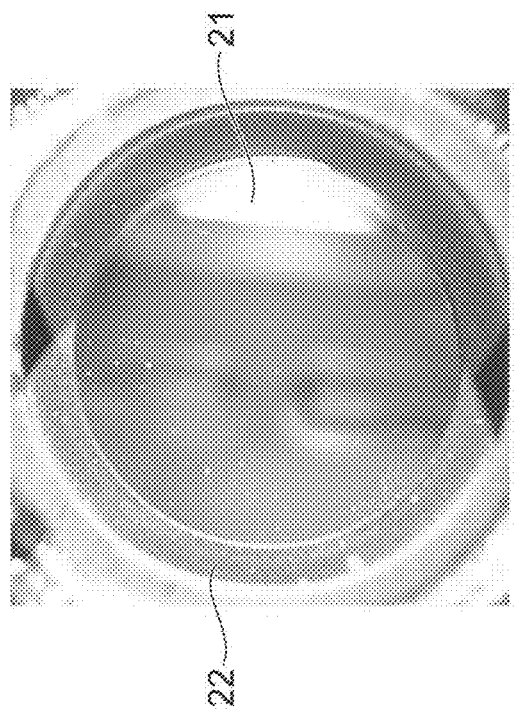
FIG. 14B is a picture showing the second implementation sample after 47 hours elapse.
Figure 15:
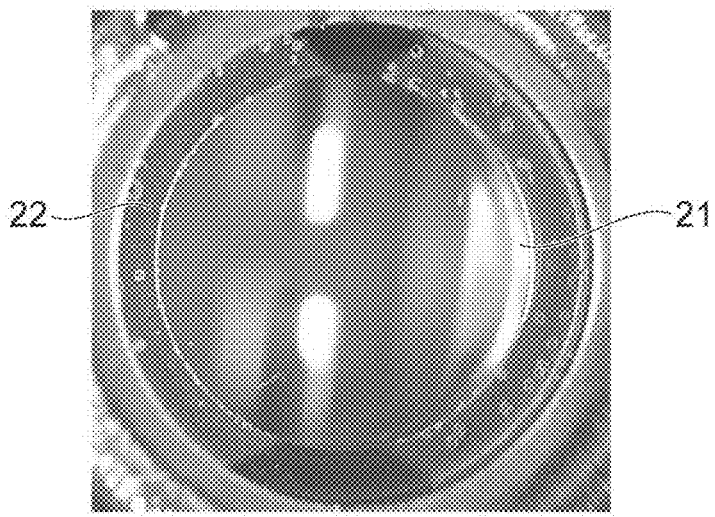
FIG. 15 is a picture showing the second implementation sample after 93 hours elapse.

FIGS. 14A to 15 show a result for a second implementation sample. The second implementation sample corresponds to the configuration of the modified example of the second embodiment in which the ALD layer formed of alumina is provided as the protection layer 120. As shown in FIGS. 14A to 15, in the second implementation sample, extraneous matter was not deposited on the surfaces of the first window member 21 and the first frame member 22 even at the time point after 93 hours from the start of the operation. From this result, it is known that the deposition of extraneous matter can be suppressed by providing the protection layer 120.

Figure 16A:
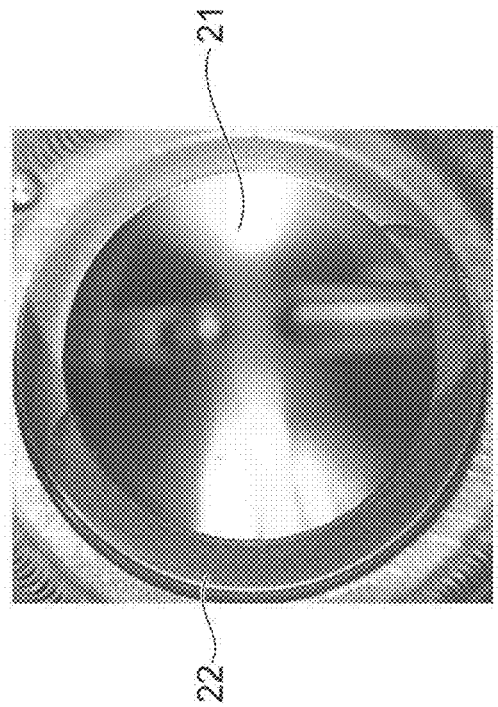
FIG. 16A is a picture showing a third implementation sample immediately after an operation starts.
Figure 16B:
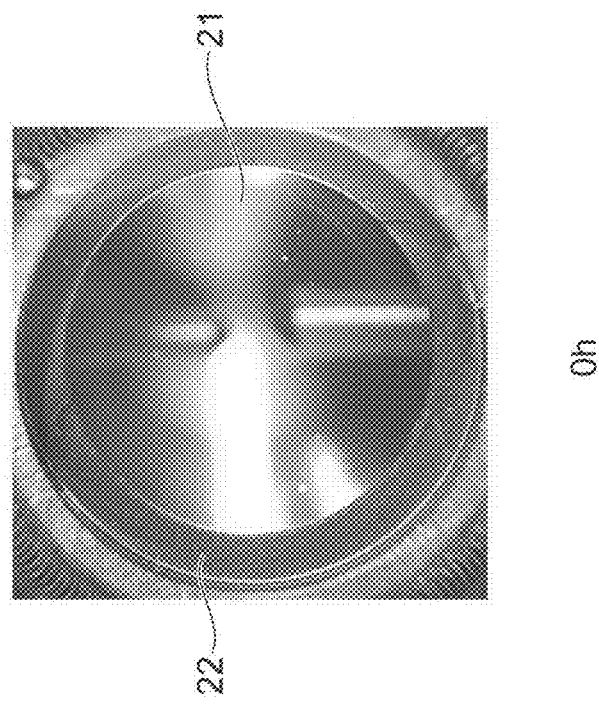
FIG. 16B is a picture showing the third implementation sample after 140 hours elapse.
Figure 17:
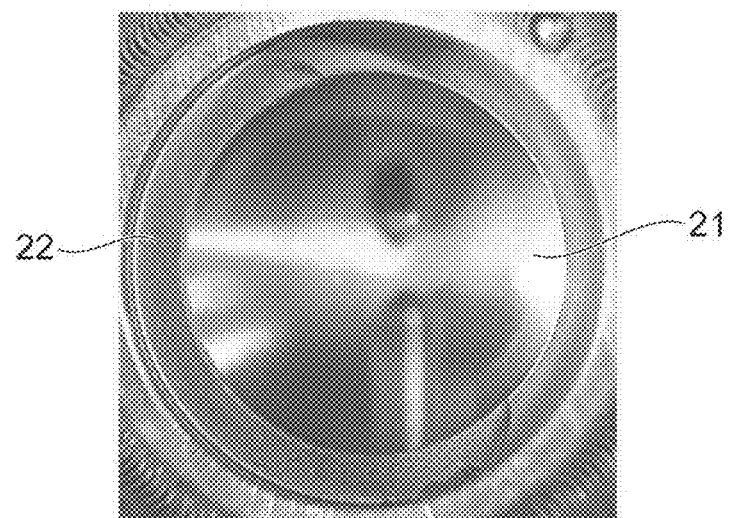
FIG. 17 is a picture showing the third implementation sample after 328 hours elapse.

FIGS. 16A to 17 show a result for a third implementation sample. The third implementation sample corresponds to the configuration of the first embodiment. During the operation, the gas G2 was supplied to the flow path 63 (the flow path 110 and the flow path 111). As shown in FIGS. 16A to 17, in the third implementation sample, extraneous matter was not deposited on the surfaces of the first window member 21 and the first frame member 22 even at the time point after 328 hours from the start of the operation. From this result, it is known that the deposition of extraneous matter can be suppressed by allowing the gas G2 to flow to the flow path 110 and the flow path 111.

Modified Examples

The present disclosure is not limited to the embodiment and the modified example. A through-hole which is partitioned from the internal space S3 and communicates with the second opening 12 of the second window portion 30 may be formed as an extension space inside the housing 10 instead of or in addition to the groove 100. Alternatively, a through-hole shaped extension space may be formed by covering the groove 100 with a lid-shaped member. A groove which communicates with the second opening 12 of the second window portion 30 may be formed in the outer surface 10a of the housing 10 instead of or in addition to the groove 100. The groove may be formed in, for example, the surface 10e. In this case, when the gas G2 flows through the groove, the gas G2 can flow to the second opening 12 of the second window portion 30 and, for example, oxidation of constituting elements of a joining material 33 can be suppressed. The present disclosure is not limited to a case in which the first window member 21 and the second window member 31 are provided as independent window members in the first window portion 20 and the second window portion 30 and a part of the housing 10 may constitute the window portion by forming the housing 10 itself by a light transmitting material. The fluid is not limited to the gas and a liquid may be used. In the first embodiment, in addition to the groove 100, as in the second embodiment, the protection layer 120 that covers the joining material 23 may be provided at the joining position between the first window member 21 and the housing 10. Accordingly, the joining material 23 can be shielded by the protection layer 120 and, for example, oxidation of constituting elements of the joining material 23 can be suppressed. As a result, since it is possible to suppress that constituting elements of the joining material 23 are deposited as extraneous matter, it is possible to suppress a decrease in life caused by the stain of the first window portion 20 and to improve the life of the light emitting sealed body 2.

In the first embodiment, the flow path 110 may be formed between the housing 10 and the casing 6 in such a manner that a groove is formed in the inner surface of the casing 6 and an opening portion of the groove is closed by the housing 10. For example, the flow path 110 may be formed in such a manner that a groove is formed in the wall portion 612 of the main body portion 61 and an opening portion of the groove is closed by the surface 10b of the housing 10. That is, the flow path 110 may be configured by the groove formed in the casing 6. In this case, the outer surface 10a of the housing 10 may be provided with the groove 100 or may not be provided with the groove.

In the second embodiment, a protection layer that covers the joining material 33 may be provided at a joining position (a second joining position) between the second window member 31 and the housing 10 instead of or in addition to the joining position (the first joining position) between the first window member 21 and the housing 10. In this case, the joining material 33 can be shielded by the protection layer and, for example, oxidation of constituting elements of the joining material 33 can be suppressed. The protection layer may be a plated layer or an ALD layer. The protection layer may be an ALD layer having the same composition as that of the material forming the second window member 31.

In the second embodiment, the protection layer 120 may be provided so as to cover at least the joining material 23 and may not be necessarily provided in the entire surface of a region other than the region M in the exposed surfaces of the first window member 21 and the first frame member 22. The protection layer 120 may be provided only on the side of the light emitting surface 21b of the first window member 21 or may be provided only on the side of the light incident surface 21c thereof. Similarly, in the modified example of the second embodiment, the protection layer 120 may be provided so as to cover at least the joining material 23 and may not be essentially provided in the entire surface of the exposed surfaces of the first window member 21 and the first frame member 22.

The material and shape of each component are not limited to the materials and shapes described above and various materials and shapes can be adopted. The shapes of the first opening 11 and the second opening 12 are not limited to the circular shape and may be various shapes. The shapes of the first window member 21 and the second window member 31 are not limited to the circular plate shape and may be various shapes. The groove 100 may extend toward the first window portion 20 and may not necessarily communicate with the first window portion 20 (the first opening 11) (may be apart from the first window portion 20). The groove 100 may not extend in a straight shape and may be curved. The extension directions of the first groove 101 and the second groove 102 may be different from each other. The first groove 101 and/or the second groove 102 may not reach the outer edges 10b1 and 10b2 of the surface 10b. The groove 100 may be configured only by one groove. In the present disclosure, "A and/or B" means "at least one of A and B".

The joining material 23 may be a silver brazing material not doped with titanium or may be a titanium brazing material or a nickel brazing material. This is also the same in the joining materials 18, 33, 43, 53, and 83. In the above-described embodiment, two second openings 12 are formed, but only one second opening 12 may be formed and three or more second openings 12 may be formed. A material forming the housing 10 may not be necessarily a metal material and may be an insulating material, for example, ceramic or the like. The first electrode 40 and the second electrode 50 may be omitted. Also in this case, plasma can be generated at a focal point by irradiating the discharge gas G1 with the condensed first light L1. Each of the first window member 21 and the second window member 31 may be formed of diamond or sapphire or may be formed of magnesium fluoride or quartz. The first window member 21 and/or the second window member 31 may be formed by Kovar glass.

The laser light source 3 may not be provided inside the laser excitation light source 1. For example, the laser excitation light source 1 may include an optical fiber which guides light from a light source disposed at the outside to the mirror 4 instead of the laser light source 3. In this case, a light introduction unit R which causes the first light L1 to be incident to the first opening 11 along the first optical axis A1 is configured by the optical fiber, the mirror 4, and the optical system 5.

What is claimed is:

1. A light emitting sealed body comprising:
a housing which stores a discharge gas in an internal space and is provided with a first window portion to which first light is incident and a second window portion from which second light is emitted, wherein the first light is laser light for maintaining plasma generated in the discharge gas and the second light is light from the plasma,
wherein the housing includes at least one extension space which is partitioned from the internal space and extends toward at least one of the first window portion and the second window portion, the at least one extension space being formed at an outer surface of the housing.

2. The light emitting sealed body according to claim 1,
wherein the outer surface of the housing is provided with at least one groove which extends toward at least one of the first window portion and the second window portion, and
wherein the extension space is configured by the at least one groove.

3. The light emitting sealed body according to claim 2,
wherein the at least one groove includes a pair of grooves, and
wherein the pair of grooves are formed so as to sandwich at least one of the first window portion and the second window portion.

4. The light emitting sealed body according to claim 3,
wherein the pair of grooves are located on the same straight line.

5. The light emitting sealed body according to claim 3,
wherein each of the pair of grooves is formed so as to extend from at least one of the first window portion and the second window portion to reach an edge of the outer surface of the housing.

6. The light emitting sealed body according to claim 1,
wherein the first window portion includes a first opening which is formed in the housing and a first window member that hermetically seals the first opening and transmits the first light,
wherein the second window portion includes a second opening which is formed in the housing and a second window member that hermetically seals the second opening and transmits the second light, and
wherein the extension space is formed so as to communicate with at least one of the first opening and the second opening.

7. The light emitting sealed body according to claim 6, wherein each of the first window member and the second window member is hermetically fixed to the housing by a joining material.

8. The light emitting sealed body according to claim 7, wherein the joining material is a metal brazing material.

9. The light emitting sealed body according to claim 8, wherein the metal brazing material is a titanium-doped silver brazing material.

10. The light emitting sealed body according to claim 7, wherein a protection layer which covers the joining material is provided at at least one of a first joining position between the first window member and the housing and a second joining position between the second window member and the housing.

11. The light emitting sealed body according to claim 6, wherein the first window portion further includes a first frame member that is hermetically fixed to the housing and the second window portion further includes a second frame member that is hermetically fixed to the housing, and
wherein the first window member is hermetically joined to the first frame member and is hermetically fixed to the housing via the first frame member and the second window member is hermetically joined to the second frame member and is hermetically fixed to the housing via the second frame member.

12. A light source device comprising:
the light emitting sealed body according to claim 1; and
a light introduction unit which causes the first light to be incident into the first window portion.

13. A light emitting unit comprising:
a light emitting sealed body; and
a casing which stores the light emitting sealed body,
wherein the light emitting sealed body includes a housing which stores a discharge gas and is provided with a first window portion to which first light is incident and a second window portion from which second light is emitted, wherein the first light is laser light for maintaining plasma generated in the discharge gas and the second light is light from the plasma, and
wherein the housing is fixed to the casing, a flow path for supplying a fluid is provided between the housing and the casing, and the flow path extends toward at least one of the first window portion and the second window portion.

14. The light emitting unit according to claim 13, wherein an outer surface of the housing is provided with at least one groove formed toward at least one of the first window portion and the second window portion, and
wherein the flow path is configured by the at least one groove.

15. The light emitting unit according to claim 13, wherein an inner surface of the casing is provided with at least one groove formed toward at least one of the first window portion and the second window portion, and
wherein the flow path is configured by the at least one groove.

16. A light emitting sealed body comprising:
a housing which stores a discharge gas in an internal space and is provided with a first window portion to which first light is incident and a second window portion from which second light is emitted, wherein the first light is laser light for maintaining plasma generated in the discharge gas and the second light is light from the plasma, wherein the first window portion includes a first opening which is formed in the housing and a first window member that hermetically seals the first opening and transmits the first light, and wherein the second window portion includes a second opening which is formed in the housing and a second window member that hermetically seals the second opening and transmits the second light,
wherein the housing includes at least one extension space which is partitioned from the internal space and extends toward at least one of the first window portion and the second window portion, wherein the extension space is formed so as to communicate with at least one of the first opening and the second opening,
wherein each of the first window member and the second window member is hermetically fixed to the housing by a joining material, and
wherein a protection layer which covers the joining material is provided at at least one of a first joining position between the first window member and the housing and a second joining position between the second window member and the housing.

* * * * *